(12) United States Patent
Yamazaki

(10) Patent No.: US 7,049,634 B2
(45) Date of Patent: May 23, 2006

(54) ELECTRO-OPTICAL DEVICE AND MANUFACTURING METHOD THEREOF

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 10/889,800

(22) Filed: Jul. 13, 2004

(65) Prior Publication Data
US 2004/0266042 A1 Dec. 30, 2004

Related U.S. Application Data

(62) Division of application No. 10/282,689, filed on Oct. 29, 2002, now Pat. No. 6,777,255, which is a division of application No. 09/528,113, filed on Mar. 17, 2000, now Pat. No. 6,531,713.

(30) Foreign Application Priority Data
Mar. 19, 1999 (JP) ................... 11-076967

(51) Int. Cl.
H01L 29/04 (2006.01)

(52) U.S. Cl. ....................... 257/72; 438/149

(58) Field of Classification Search ............... 438/149, 438/152, 155, 158; 257/59, 72; 349/139, 349/142, 143
See application file for complete search history.

(56) References Cited

U.S. PATENT DOCUMENTS

| 5,247,190 A | 9/1993 | Friend et al. |
| 5,399,502 A | 3/1995 | Friend et al. |
| 5,532,175 A | 7/1996 | Racanelli et al. |
| 5,543,340 A | 8/1996 | Lee |
| 5,543,947 A | 8/1996 | Mase et al. |
| 5,581,092 A | 12/1996 | Takemura |
| 5,594,569 A | 1/1997 | Konuma et al. |
| 5,604,139 A | 2/1997 | Codama et al. ............... 437/41 |
| 5,643,826 A | 7/1997 | Ohtani et al. |
| 5,644,146 A | 7/1997 | Arai et al. .................... 257/66 |
| 5,686,328 A | 11/1997 | Zhang et al. |
| 5,767,930 A | 6/1998 | Kobayashi et al. |
| 5,841,170 A | 11/1998 | Adan et al. |
| 5,903,249 A | 5/1999 | Koyama et al. |
| 5,917,563 A | 6/1999 | Matsushima ................. 349/38 |

(Continued)

FOREIGN PATENT DOCUMENTS

EP 0 451 968 10/1991

(Continued)

OTHER PUBLICATIONS

U.S. Appl. No. 09/484,843, (pending) to Ohtani filed Jan. 18, 2000, including specification, claims, abstract, drawing and PTO filing receipt.

(Continued)

Primary Examiner—David Vu
(74) Attorney, Agent, or Firm—Cook, Alex, McFarron, Manzo, Cummings & Mehler, Ltd.

(57) ABSTRACT

An electro-optical device having high operation performance and reliability, and a manufacturing method thereof. A TFT structure which is strong agains hot carrier injection is realized by disposing a Lov region 207 in an n-channel TFT 203 which forms a driver circuit. Further, Loff regions 217 to 220 and offset region are disposed in an n-channel TFT 304 which forms a pixel section, and a TFT structure of low OFF current value is realized. Further, by reducing the n-type impurity element contained in Loff regions 217 to 220 to approximately $1\times10^{16}$ to $5\times10^{18}$ atoms/cm$^3$, further reduction of OFF current can be performed.

32 Claims, 22 Drawing Sheets

U.S. PATENT DOCUMENTS

| | | | |
|---|---|---|---|
| 5,923,961 A | 7/1999 | Shibuya et al. | |
| 5,923,962 A | 7/1999 | Ohtani et al. | |
| 6,057,897 A * | 5/2000 | Ichikawa et al. | 349/48 |
| 6,166,414 A | 12/2000 | Miyazaki et al. | 257/369 |
| 6,306,694 B1 | 10/2001 | Yamazaki et al. | 438/151 |
| 6,542,137 B1 | 4/2003 | Kimura et al. | 345/76 |
| 6,635,521 B1 | 10/2003 | Zhang et al. | 438/199 |

FOREIGN PATENT DOCUMENTS

| | | |
|---|---|---|
| EP | 0 803 911 | 10/1997 |
| JP | 03-135018 | 6/1991 |
| JP | 06-037314 | 2/1994 |
| JP | 07-130652 | 5/1995 |
| JP | 07-202210 | 8/1995 |
| JP | 08-051207 | 2/1996 |
| JP | 08-078329 | 3/1996 |
| JP | 08-110530 | 4/1996 |
| JP | 10-051003 | 2/1998 |
| JP | 10-092576 | 4/1998 |
| JP | 10-135468 | 5/1998 |
| JP | 10-135469 | 5/1998 |
| JP | 10-144929 | 5/1998 |
| JP | 10-247735 | 9/1998 |
| WO | WO 90/13148 | 11/1990 |

OTHER PUBLICATIONS

U.S. Appl. No. 09/502,675, (pending) to Yamazaki filed Feb. 11, 2000, including specification, claims, abstract, drawings and PTO filing receipt.

U.S. Appl. No. 09/533,040, (allowed) to Yamazaki filed Mar. 22, 2000, including specification, claims-as-filed, allowed claims, abstract, drawings and PTO filing receipt.

U.S. Appl. No. 09/544,801, (pending) to Yamazaki et al, filed Apr. 7, 2000, including specification, claims, abstract, drawings and PTO filing receipt.

U.S. Appl. No. 09/559,185, (pending) to Yamazaki filed Apr. 27, 2000, including specification, claims, abstract, drawings and PTO filing receipt.

Hwang et al., "Novel Polysilicon/Tin Stacked-Gate Structure For Fully-Depleted SOI/CMOS," *IEDM 92*, pp. 345-348, Dec. 13, (1992).

Hwang et al., "High Performance Submicron SOI/CMOS With An Elevated Souce/Drain Structure," *Proceedings Of The Annual SOS/ SOI Technology Conference, IEEE*, vol. 19, pp. 132-133, May 10, (1993).

Tanaka et al., "Ultrafast Operation Of $V_{th}$-Adjusted p+ -n+ Double-Gate SOI MOSFET's," *IEEE Electron Device Letters*, vol. 19, pp. 386-388, Oct. 15, (1994).

Yoshida et al., "A Full-Color Thresholdless Antiferroelectric LCD Exhibiting Wide Viewing Angle With Fast Response Time," *SID 97 Digest*, pp. 841-844, Jan. 1, (1997).

Hatano et al., "A Novel Self-Aligned Gate-Overlapped LDD Poly-Si TFT With High Reliability And Performance," *IEDM 97*, pp. 523-526, Jan. 1, (1997).

Furue et al., "P-78: Characteristics And Driving Scheme Of Polymer-Stabilized Monostable FLCD Exhibiting Fast Response Time And High Contrast Ratio With Gray-Scale Capability," *SID 98 Digest*, pp. 782-785, Jan. 1, (1998).

Choi et al., "Gate-Overlapped Lightly Dpoed Drain Poly-Si Thin-Film Transistors For Large Area—AMLCD," *IEEE Transactions On Electron Devices*, vol. 45, No. 6, pp. 1272-1279, Jun. 1, (1998).

Terada et al., "Half-V Switching Mode FLCD," *Proceedings Of The 46th Applied Physics Association Lectures,* 28-V-8, p. 1316, Mar. (1999).

Schenk et al., "Polymers For Light Emitting Diodes," *EuroDisplay '99*, pp. 33-37, Sep. 6, (1999).

Yoshihara, "Time Division Full Color LCD By Ferroelectric Liquid Crystal," *Ekisho*, vol. 3, No. 3, pp. 190-194, Jul. 25, (1999).

U.S. Appl. No. 09/441,258, (pending) to Nakajima including specification, claims, abstract, drawings and PTO filing receipt.

U.S. Appl. No. 09/454,146, (pending) to Yamazaki et al., including specification, claims, abstract, drawings and PTO filing receipt.

Tanaka et al., "Ultrafast Operation of $V_{th}$ -Adjusted p+ -n+ Double-Gate SOI MOSFET's,"*IEEE Electron Device Letters*, vol. 15, No. 10, pp. 386-388, Oct., (1994).

* cited by examiner

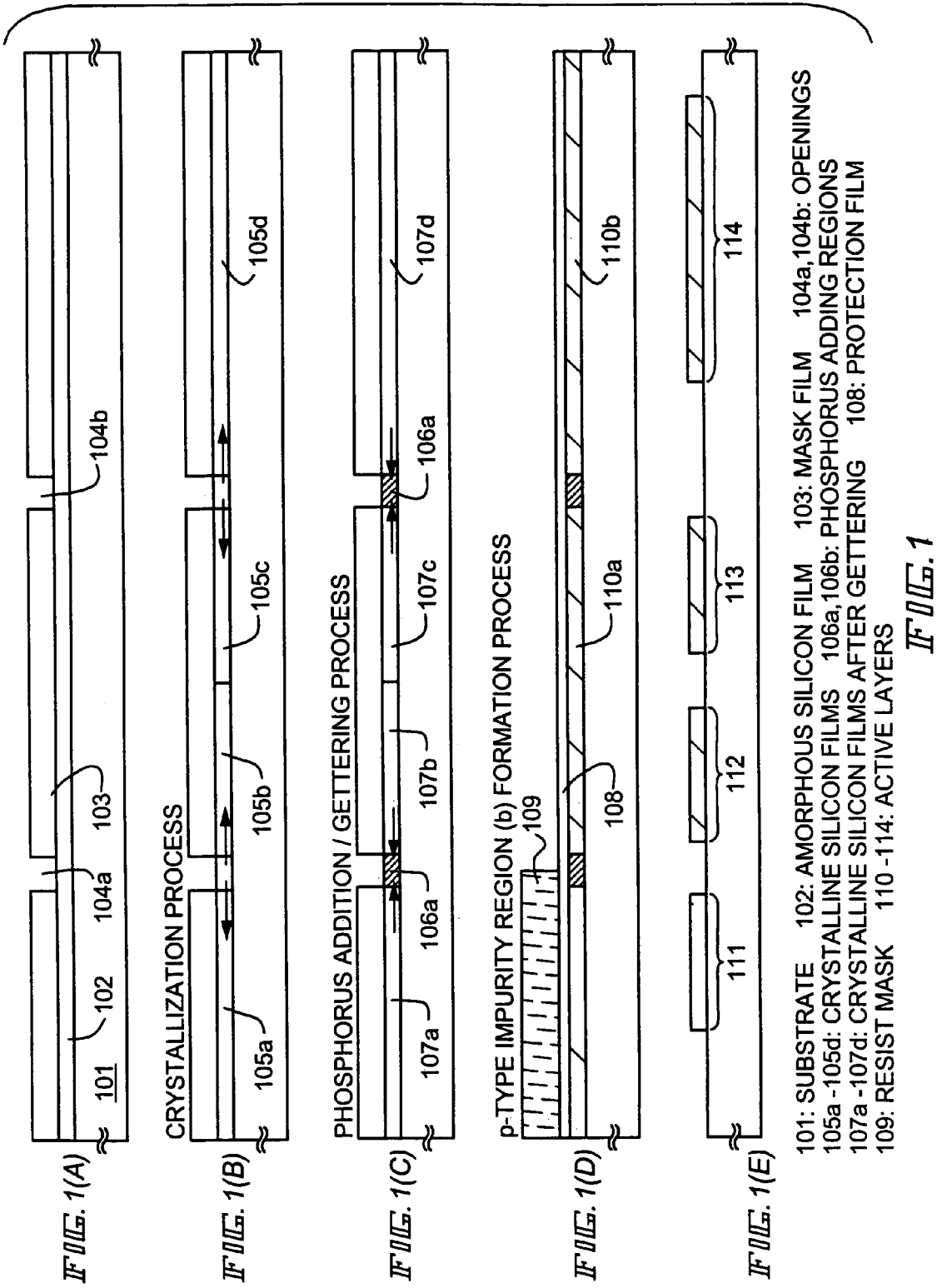

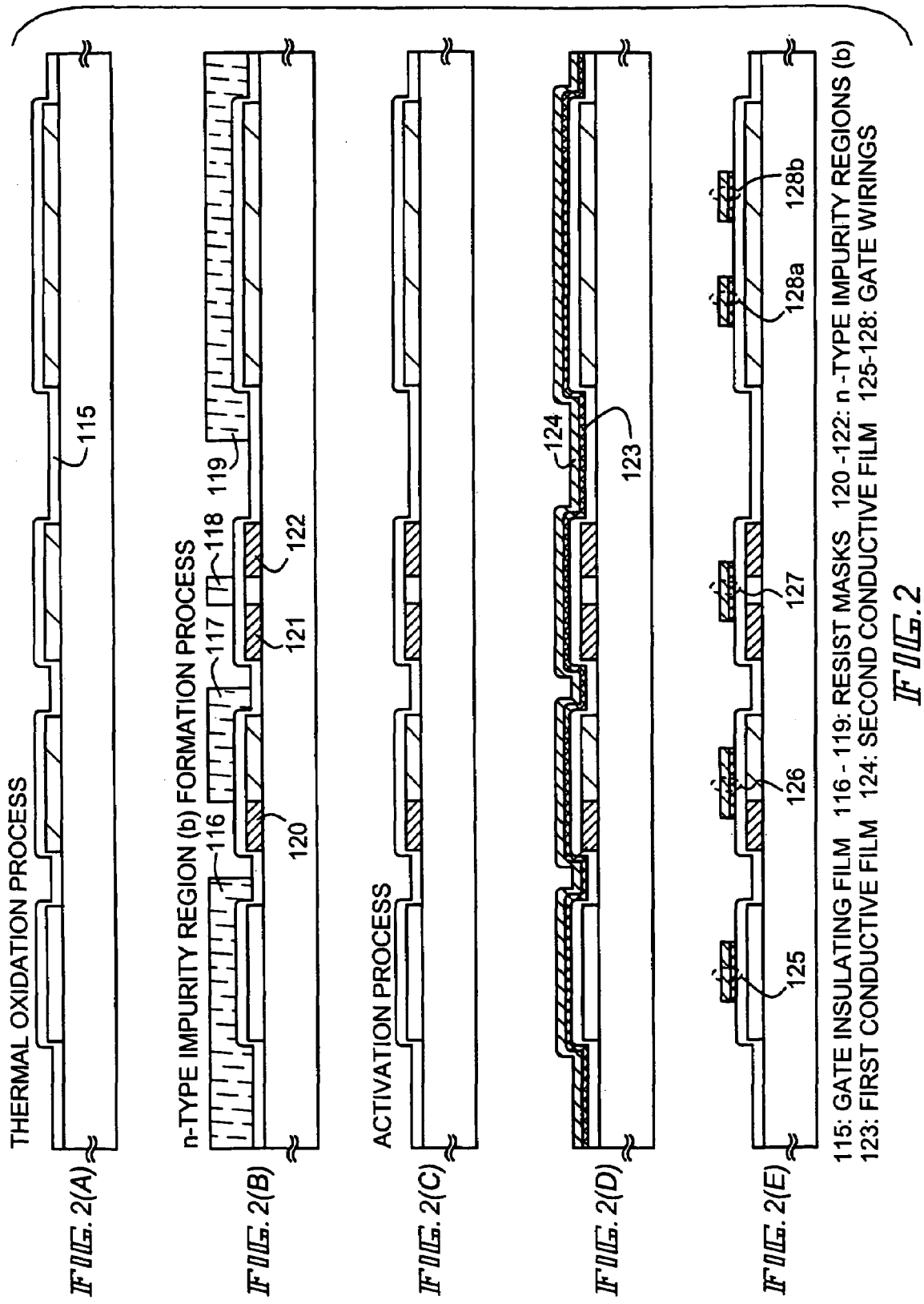

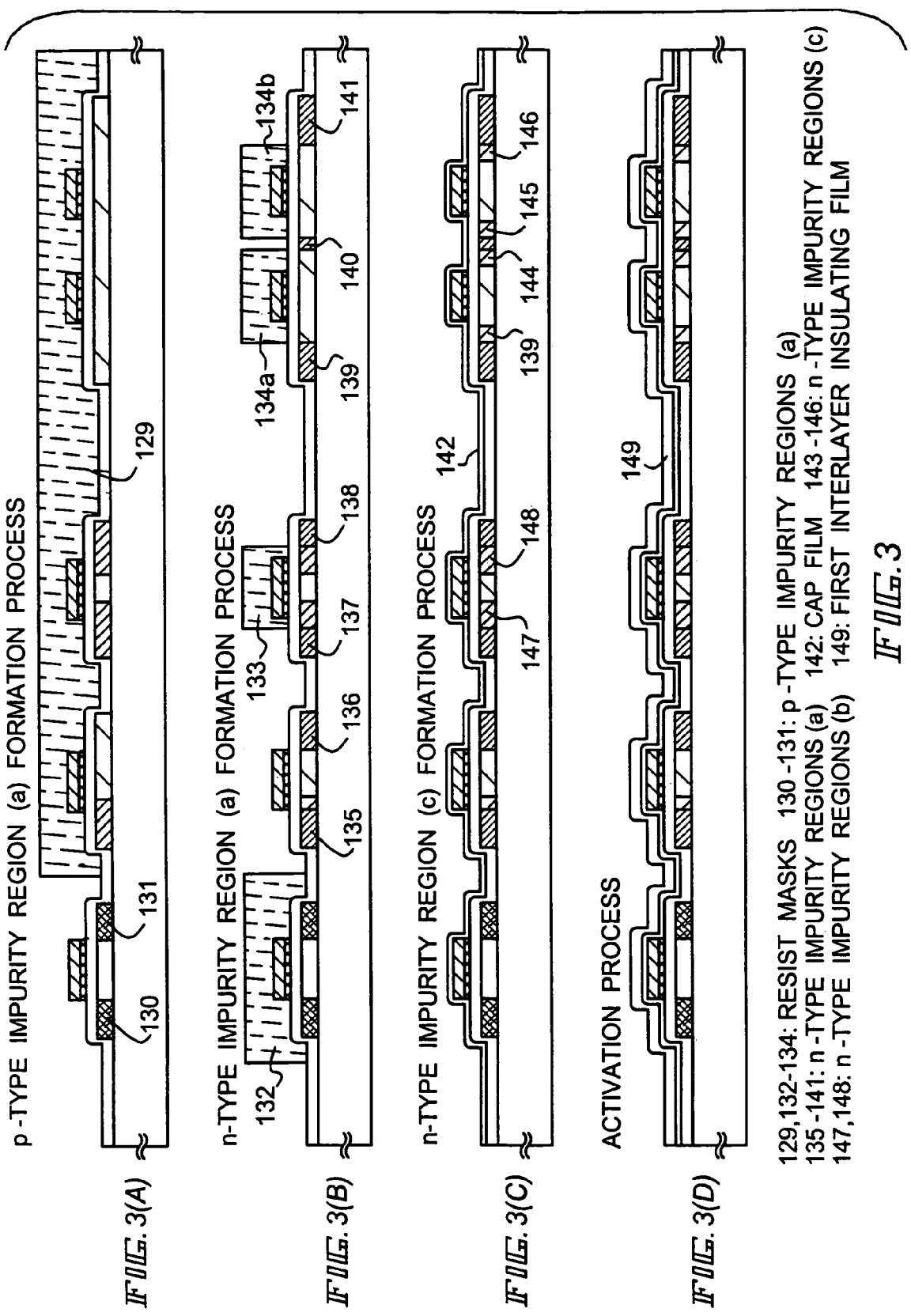

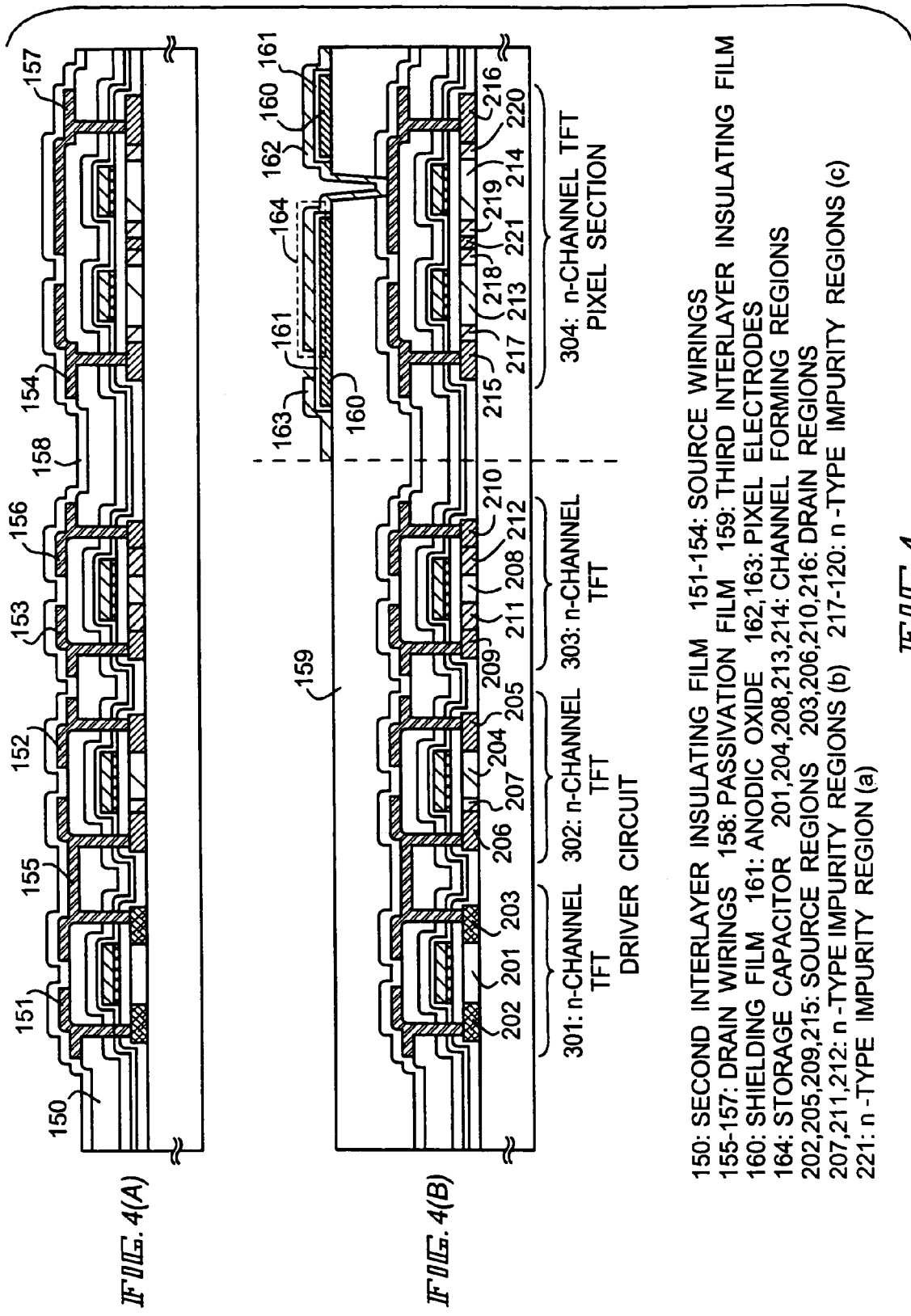

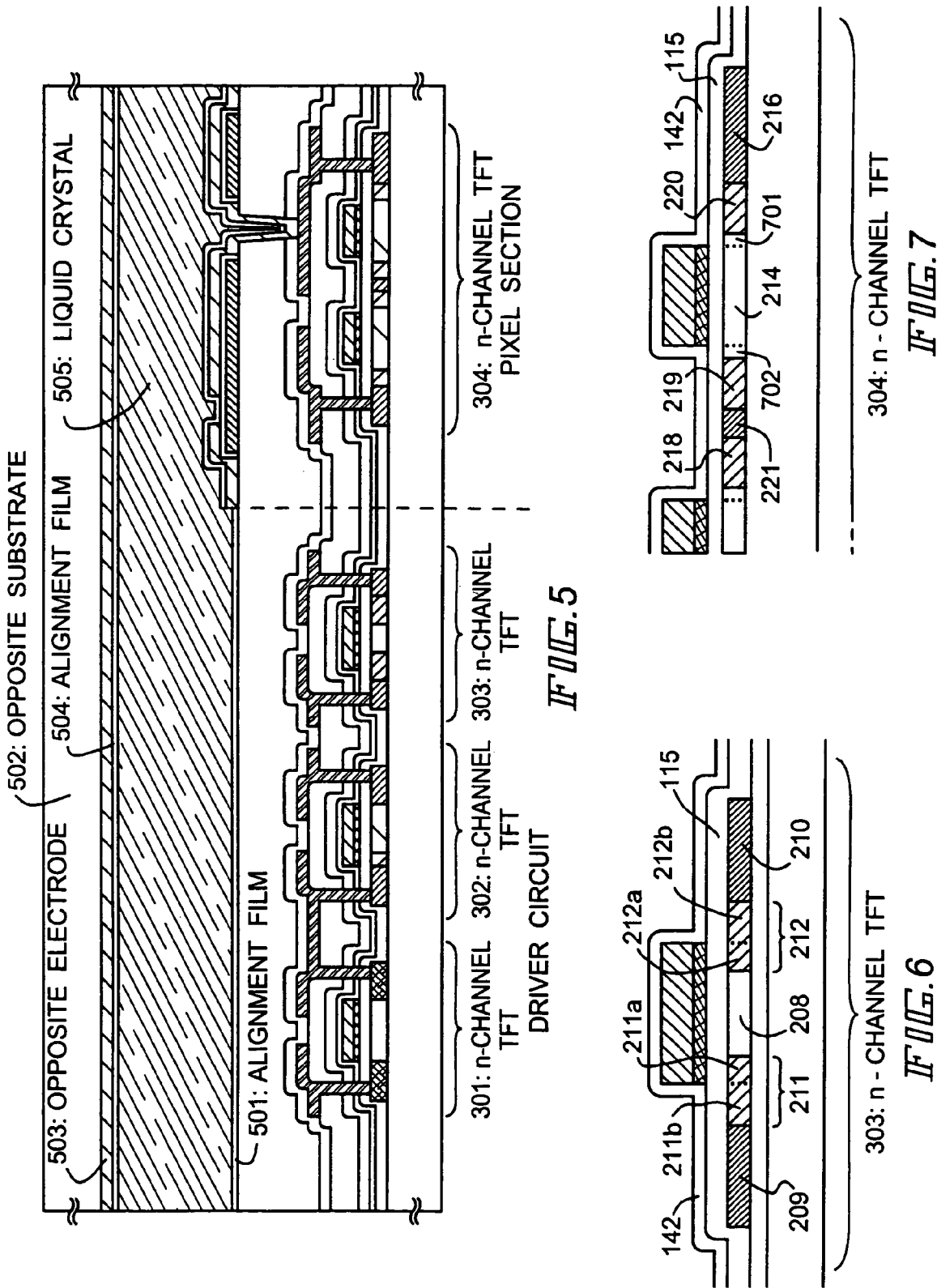

101: SUBSTRATE   801: PIXEL SECTION
802: SCANNING SIGNAL DRIVER CIRCUIT
803: IMAGE SIGNAL DRIVER CIRCUIT   804: FPC
805: TERMINAL   806, 807: CONNECTION WIRINGS
304: PIXEL TFT   128: GATE WIRING   154: SOURCE WIRING
162: PIXEL ELECTRODE   164: STORAGE CAPACITOR
808: OPPOSITE SUBSTRATE

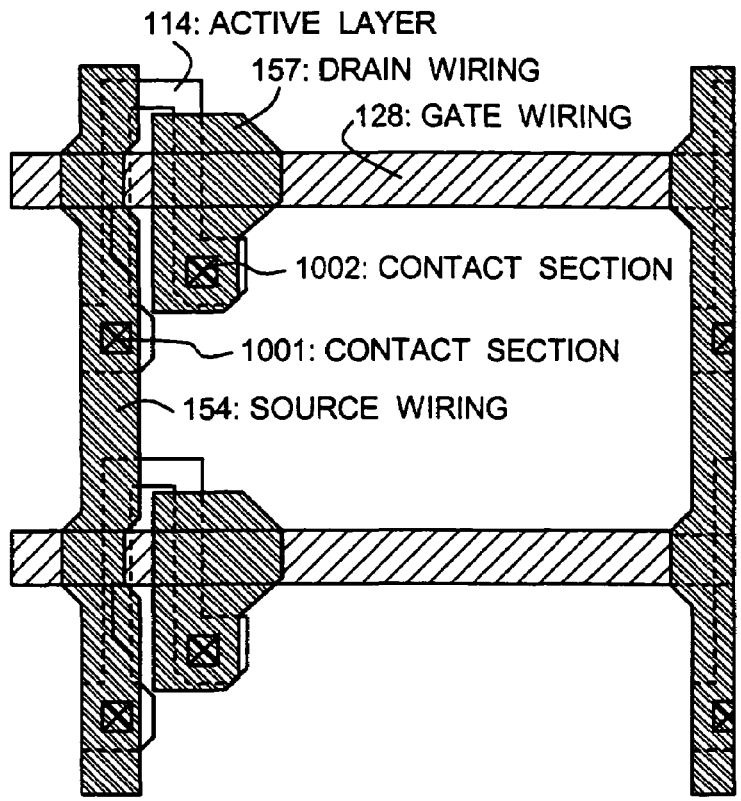
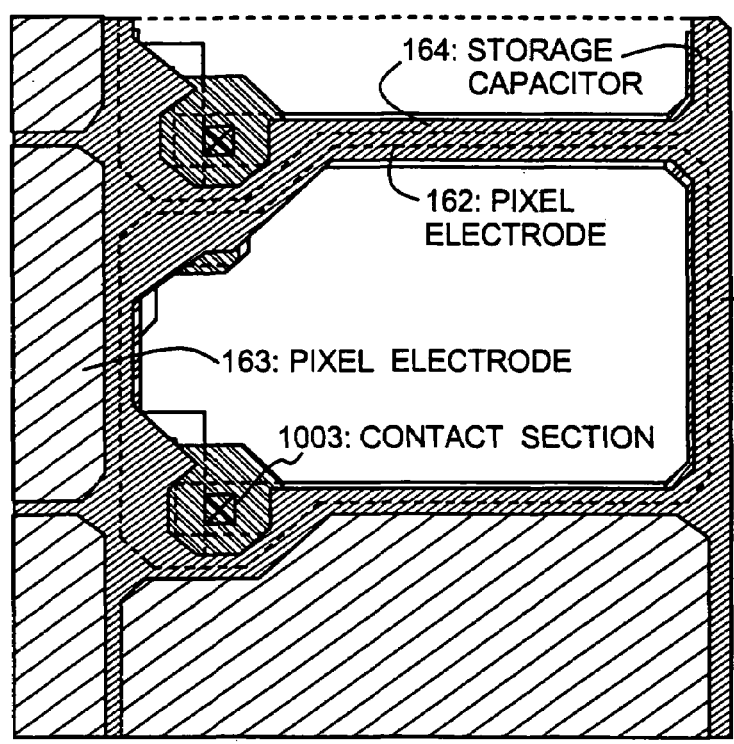
FIG. 10

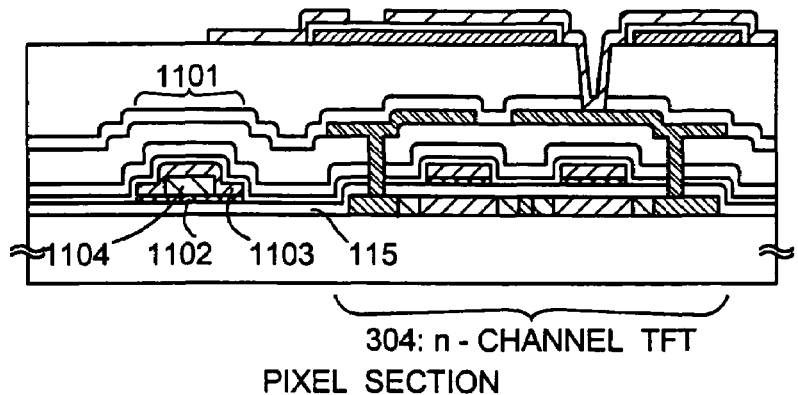
FIG. 11(A)
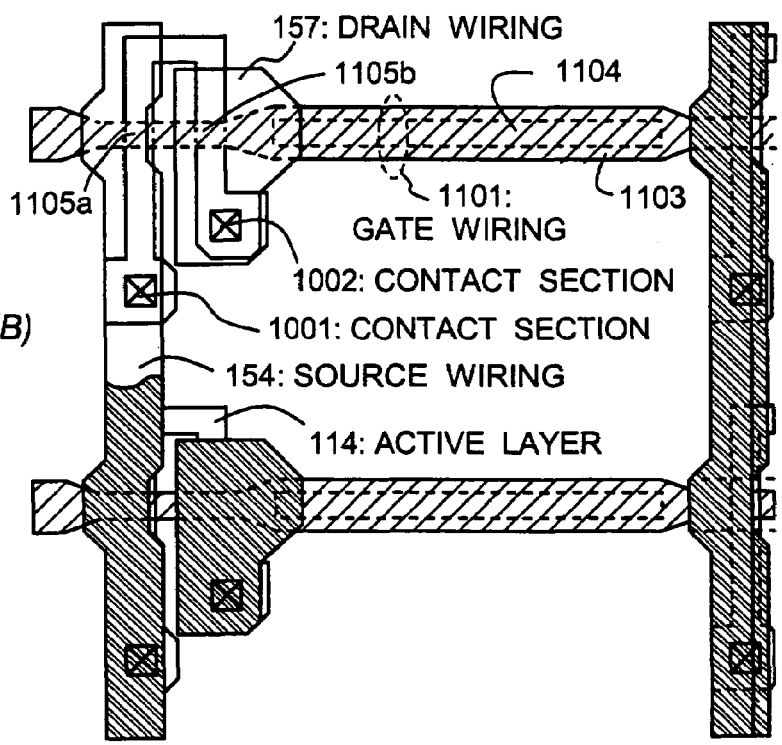
FIG. 11(B)
FIG. 11

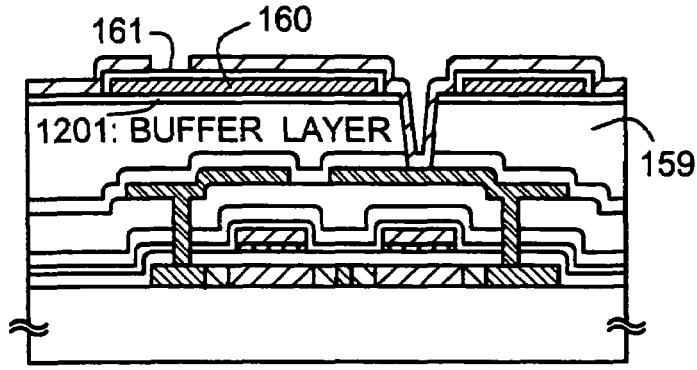
FIG.12(A)
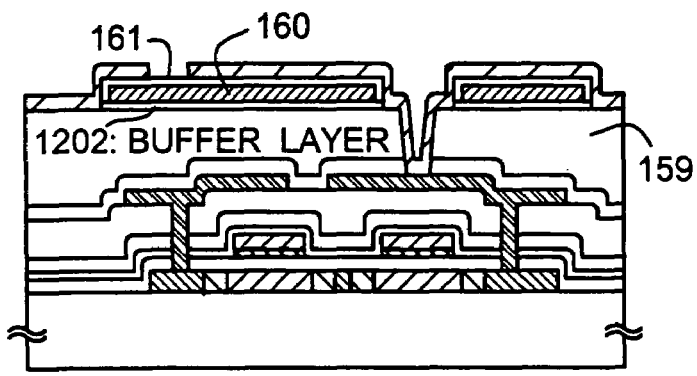
FIG.12(B)
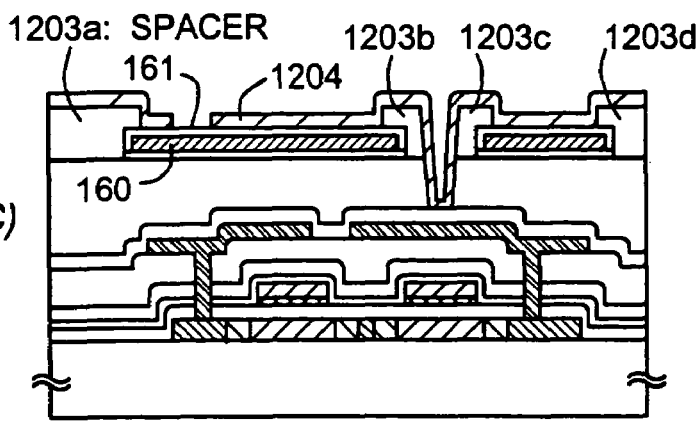
FIG.12(C)
FIG.12

115: GATE INSULATING FILM
140, 141: n-TYPE IMPURITY REGIONS (a)
142: CAP FILM  1401a, 1401b: SIDE WALLS
1402a, 1402B: N-TYPE IMPURITY REGIONS (c)
1403a, 1403b: OFFSET REGIONS

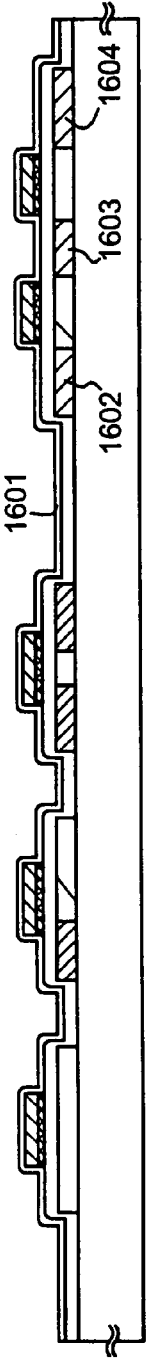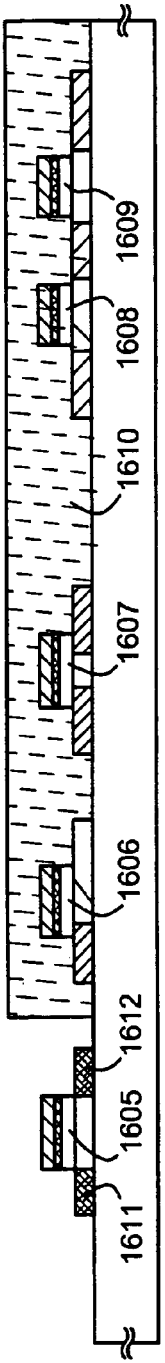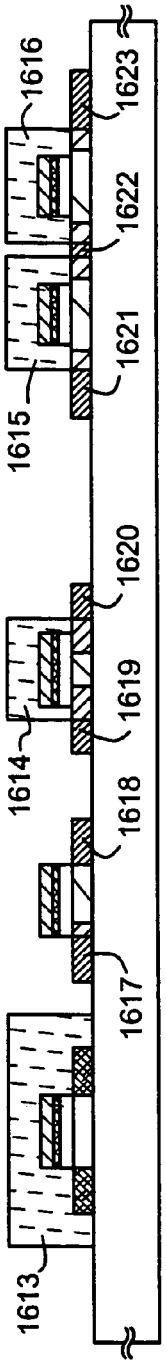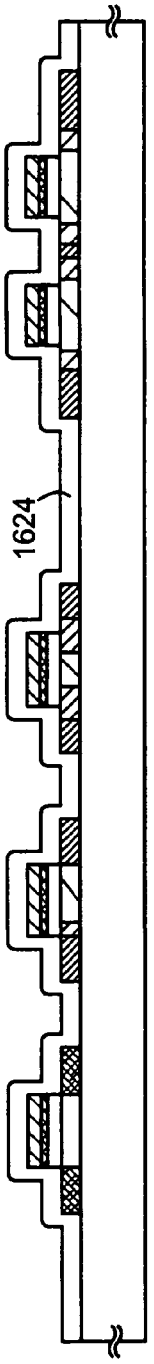
FIG. 16
1601: CAP FILM  1602-1604: n-TYPE IMPURITY REGIONS (c)  1605-1609: GATE INSULATING FILMS
1610,1613-1616: RESIST MASKS  1611,1612: p-TYPE IMPURITY REGIONS (a)
1617-1623: n-TYPE IMPURITY REGIONS (a)  1624: FIRST INTERLAYER INSULATING FILM 82: PIXEL SECTION  82: X - DIRECTION (SOURCE) DRIVER CIRCUIT
83: Y- DIRECTION (GATE) DRIVER CIRCUIT  84: SWITCHING TFT
85: CAPACITOR  86: CURRENT CONTROLLING TFT
87: ORGANIC EL ELEMENT  88a, 88b: X- DIRECTION SIGNAL LINES
89a - 89c: Y- DIRECTION SIGNAL LINES  90a, 90b: POWER SUPPLY LINES

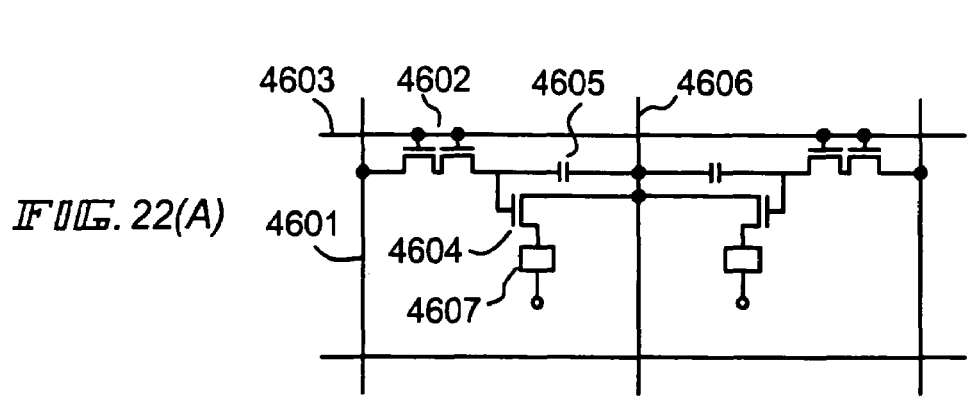
FIG. 22(A)
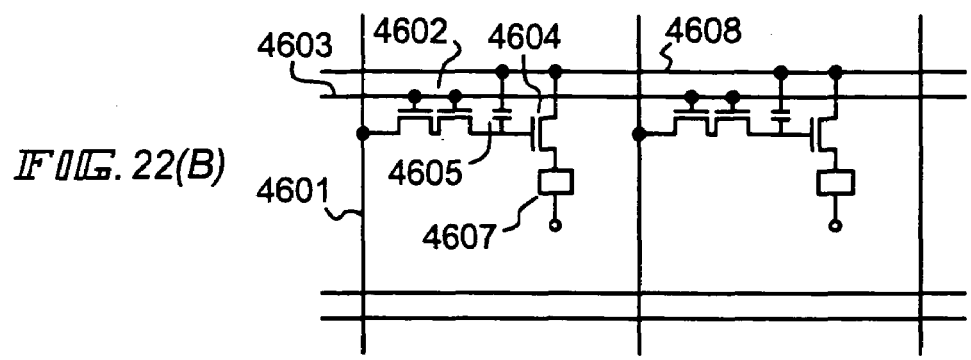
FIG. 22(B)
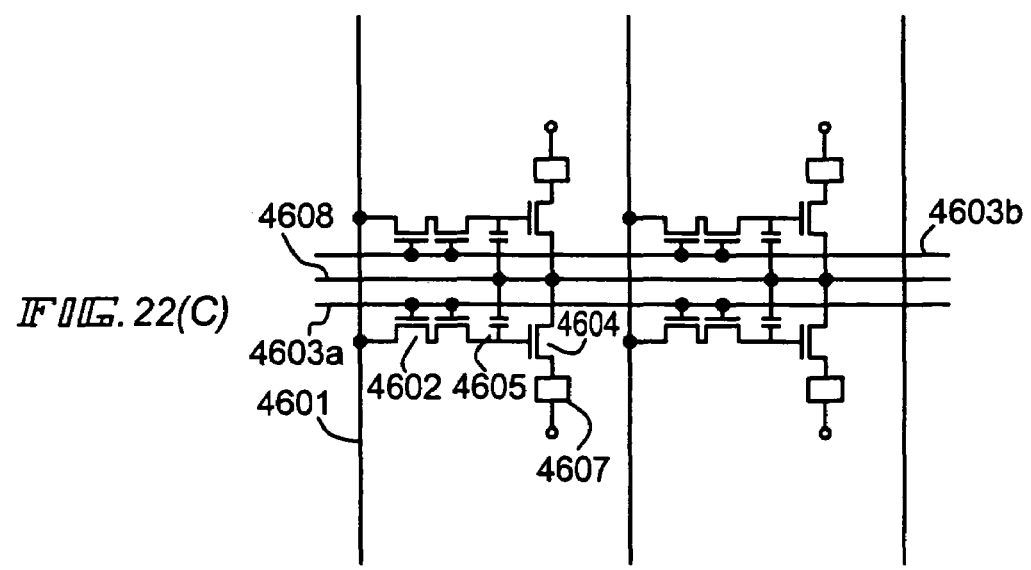
FIG. 22(C)
FIG. 22

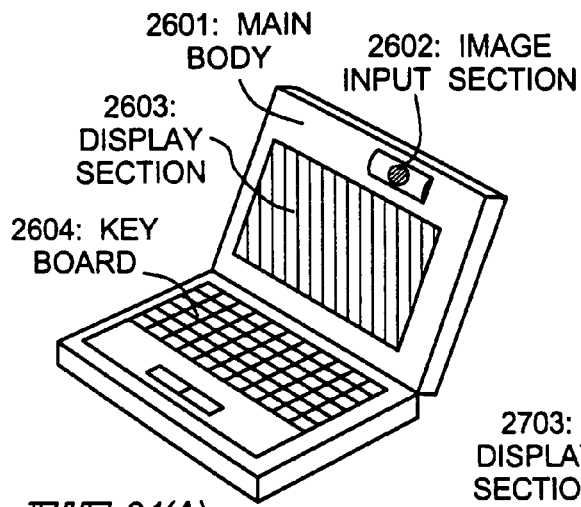
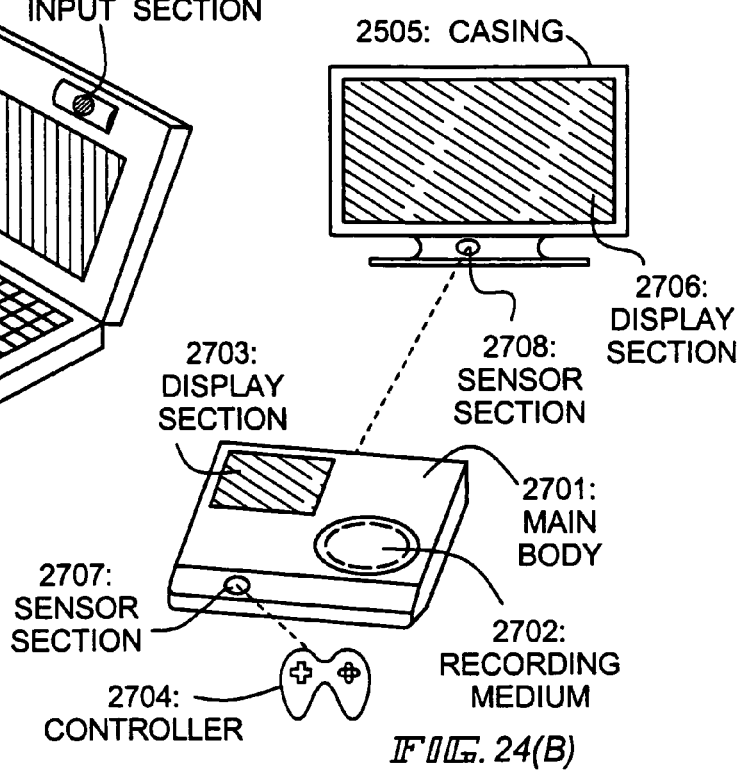
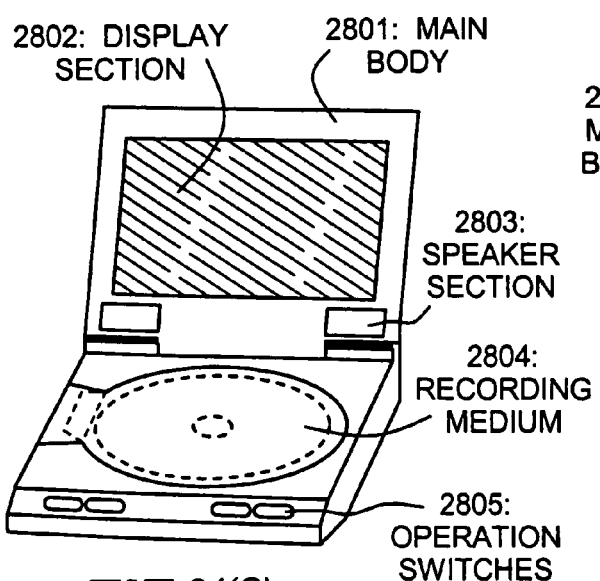
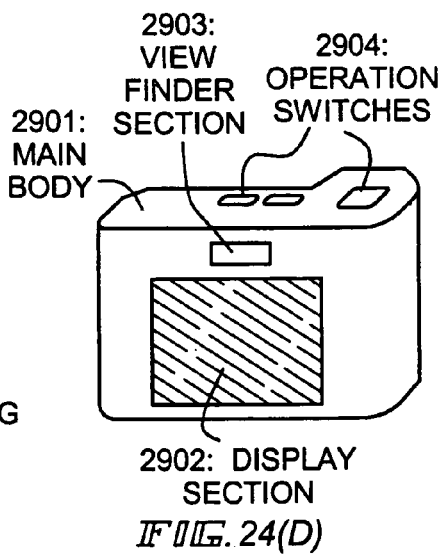
FIG. 24

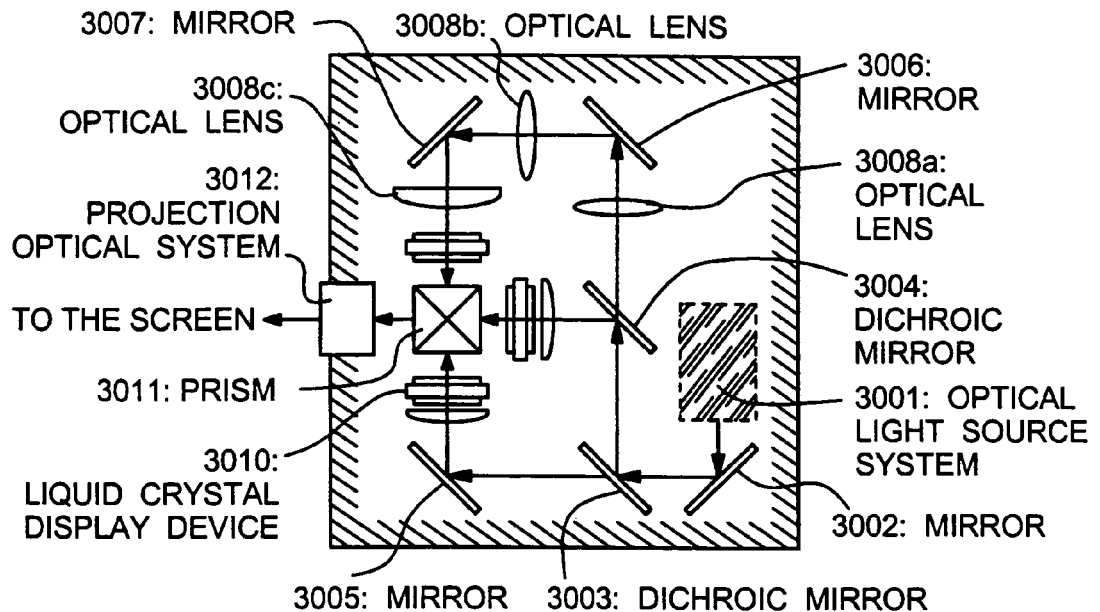
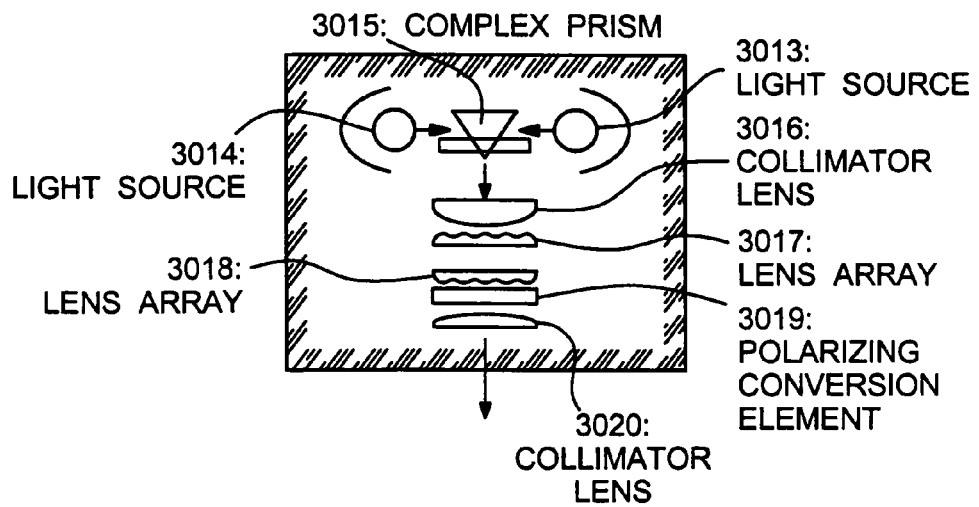
FIG. 25

ELECTRO-OPTICAL DEVICE AND MANUFACTURING METHOD THEREOF

This application is a division of Ser. No. 10/282,689 filed on Oct. 29, 2002, now U.S. Pat. No. 6,777,255, which is a division of application Ser. No. 09/528,113 filed on Mar. 17, 2000, now U.S. Pat. No. 6,531,713.

BACKGROUND OF THE INVENTION

1. Field of the Invention

The present invention relates to a semiconductor device, which has circuits comprising thin film transistors (hereinafter referred to as TFTs) formed over a substrate having an insulating surface, and a fabricating process thereof. Particularly, the invention relates to an electro-optical device (also called electro-optical device) represented by a liquid crystal display device or an EL (electro-luminescence) display device which is constituted in such a manner that a pixel section (pixel circuit) and driving circuits (control circuits) disposed in its periphery are provided on the same substrate and an electric appliance (also called an electronic apparatus) which incorporates an electro-optical device.

Throughout the Specification, a semiconductor device denotes a device in general which functions by utilizing the semiconductor characteristics, and the above-mentioned electro-optical device and an electric appliance which incorporates the electro-optical device are also covered by the semiconductor device.

2. Description of the Related Art

The development of semiconductor devices, which comprise large-area integrated circuit formed from TFTs on substrate having insulating surface is being advanced. Known as representative examples of these semiconductor devices are an active matrix type liquid crystal display device, an EL display device, and a contact type image sensor. Particularly, TFTs having crystalline silicon film (typically polycrystalline silicon film) for active layers (hereinafter referred to as polycrystalline silicon TFTs) have a high field effect mobility and thus can form various functional circuits.

For example, in an active matrix type liquid crystal display device, a pixel section which performs image display, and driver circuits for controlling the pixel section (also referred to as peripheral driver circuits) such as shift registers, level shifters, buffers and sampling circuits which are based on CMOS circuits are formed by every function block on one substrate.

Since such driver circuits do not always have the same operating condition, the characteristics required of the TFTs naturally differ not a little. In the pixel section, pixel TFTs functioning as switching elements and auxiliary storage capacitance are provided, and a voltage is applied to the liquid crystal to drive it. Here, the liquid crystal needs to be driven by altering current, and the system called frame inversion driving is often adopted. Accordingly, for the characteristics required of the TFTs, it was necessary to keep the OFF-current value (the value of the drain current flowing when a TFT is in OFF-operation) sufficiently low. Further, the buffer, to which a high driving voltage is applied, had to have its withstand voltage enhanced up to such a degree that the buffer would not be broken even if a high voltage was applied thereto. Further, in order to enhance the current driving ability, it was necessary to sufficiently secure the ON-current value (the value of the drain current flowing when the TFT is in ON-operation).

However, there was a problem that the OFF-current value of a polycrystalline silicon TFT is apt to become high. Further, in case of a polycrystalline silicon TFT, there is observed the deterioration phenomenon that its ON-current value falls as in case of a CMOS transistor used in an IC or the like. The main cause therefor lies in the injection of hot carriers; it is considered that the hot carriers generated by the high electric field in the vicinity of the drain cause the deterioration phenomenon.

As a TFT structure for lowering the OFF-current value, the lightly doped drain (LDD) structure is known. This structure is made in such a manner that, between the channel forming region and the source region or the drain region to which an impurity is added at a high concentration, an impurity region having a low concentration is provided. This low concentration impurity region is known as LDD region.

Further, as a structure for preventing the degradation of the ON-current value due to the hot carrier injection, so-called GOLD (Gate-drain Overlapped LDD) structure is known. Because the LDD region is disposed so as to overlap the gate wiring through the gate insulating film, this structure is effective for preventing the injection of hot carriers in the vicinity of the drain to enhance the reliability. For example, Mutsuko Hatono, Hajime Akimoto and Takeshi Sakai, IEDM97 TECHNICAL DIGEST, pp. 523–526, 1997, discloses a GOLD structure by the side wall formed of silicon; and it is confirmed that a very high reliability can be obtained as compared with the TFTs of other structures.

Further, in the pixel section of an active matrix liquid crystal display device, a TFT is disposed to each of several hundred thousands to several millions of pixels, and these TFTs are each provided with a pixel electrode. An opposing electrode is disposed on the opposing substrate side interposing liquid crystal, thus forming a kind of capacitor with the liquid crystal as a dielectric. Then the voltage applied to each of the pixels is controlled by the switching function of the TFT to thereby control the charges to this capacitor, whereby the liquid crystal is driven, and the quantity of transmitted light is controlled, thus displaying an image.

However, the stored capacitance of this capacitor is gradually decreased due to the leakage current caused for causes pertaining to the OFF-current etc., which in turn becomes the cause for varying the quantity of transmitted light to lower the contrast of the image display. Thus, according to the known technique, a capacitor wiring is provided to form in parallel a capacitor (storage capacitance) other than the capacitor constituted with the liquid crystal as its dielectric, whereby the capacitance lost by the capacitor having the liquid crystal as its dielectric was compensated for.

However, the characteristics required of the pixel TFTs in the pixel section and the characteristics required of the TFTs (hereinafter referred to as driver TFTs) in the driver circuits such as the shift registers and the buffers are not necessarily identical with each other. For example, in case of a pixel TFT, a large reverse bias (minus, in case of an n-channel type TFT) voltage is applied to the gate wiring, but a driver TFT is never operated with a reverse bias voltage applied thereto. Further, the operating speed of the former TFT is not required to be as high as the latter.

Further, the GOLD structure has a high effect for preventing the deterioration of the ON-current value, indeed, on the other hand however, has the defect that the OFF-current value becomes large as compared with the ordinary LDD structure. Accordingly, it could not be considered that the GOLD structure was a desirable structure particularly for the pixel TFT. It has been known that, conversely, the ordinary LDD structure has a high effect for suppressing the OFF-current value but is low in resistance to the injection of hot carriers.

As stated above, it was not always desirable to form all the TFTs from the same structure, in a semiconductor device including a plurality of electric circuits as in case of an active matrix type liquid crystal display device.

Further, in case, as according to the known technique described above, a storage capacitance using a capacitor wiring is formed in the pixel section so as to secure a sufficient capacitance, the aperture ratio (the ratio of the image-displayable area to the area of each pixel) had to be sacrificed. Particularly in case of a small-sized, highly precise panel as is used in a projector type display device, the area per pixel is small, so that the reduction of the aperture ratio due to the capacitor wiring has become a problem.

The present invention relates to a technique for giving solutions to such problems, and it is the purpose of the invention to make the structures of the TFTs disposed in the respective circuits of a semiconductor device appropriate in accordance with the functions of the circuits to thereby enhance the operability and reliability of the semiconductor device. Further, it is an object of the invention to provide a fabrication process for realizing such a semiconductor device.

Another purpose of the invention is to provide a structure, for a semiconductor device having a pixel section, which structure is constructed in such a manner that the area of the storage capacitance provided to each pixel is reduced to enhance the aperture ratio. Further, the invention provides a process of fabricating such a pixel section.

SUMMARY OF THE INVENTION

In order to solve the above stated problems, the constituents of the present invention are:

an electro-optical device comprising a pixel section and a driver circuit over a same substrate is characterized in that:

a part or all of a LDD region of an n-channel TFT which comprises the driver circuit is formed so as to overlap with a gate wiring of the n-channel TFT by interposing a gate insulating film;

a LDD region of a pixel TFT which comprises the pixel section is formed so as not to overlap with a gate wiring of the pixel TFT by interposing a gate insulating film; and an offset region is formed between a channel forming region and a LDD region of the pixel TFT.

In the above stated constitutions, it is preferable that the LDD region of an n-channel TFT which comprises the driver circuit includes an n-type impurity element at a higher concentration than the LDD region of the pixel TFT. In concrete, a concentration of 2 to 10 times that of the LDD region of the pixel TFT is preferable. More concretely, the LDD region of an n-channel TFT which comprises the driver circuit includes an n-type impurity element in a concentration range of $2\times10^{16}$ to $5\times10^{19}$ atoms/cm$^3$ and the LDD region of the pixel TFT includes an n-type impurity element in a concentration range of $1\times10^{16}$ to $5\times10^{18}$ atoms/cm$^3$.

Further, another constitutions of the present invention are: an electro-optical device comprising a pixel section and a driver circuit over a same substrate is characterized in that:

the driver circuit comprises a first n-channel TFT in which all of a LDD region is formed to overlap a gate wiring by interposing a gate insulating film and a second n-channel TFT in which a part of a LDD region is formed to overlap a gate wiring by interposing a gate insulating film;

a LDD region of a pixel TFT which comprises the pixel section is formed so as not to overlap a gate wiring of the pixel TFT by interposing a gate insulating film; and an offset region is formed between a channel forming region and a LDD region of the pixel TFT.

In the above constitutions, n-type imurity element is included in the LDD region of the first n-channel TFT and/or the LDD region of the second n-channel TFT at a concentration higher than the LDD region of the pixel TFT (2 to 10 times in concrete).

Further, it is preferable that the LDD region formed in the first n-channel TFT is formed between a drain region and a channel forming region of the first n-channel TFT, and LDD regions formed in the second n-channel TFT are formed to sandwich a channel forming region of the second n-channel TFT.

Further, the constitutions regarding manufacturing process for realizing the constitutions of the present invention are: a method for manufacturing an electro-optical device which comprises a pixel section and a driver circuit over a same substrate comprising:

process (A) for forming a region which includes an n-type impurity element in an active layer of an n-channel TFT which forms the driver circuit in a concentration range of $2\times10^{16}$ to $5\times10^{19}$ atoms/cm$^3$;

process (B) for forming a region which includes an n-type impurity element in an active layer of an n-channel TFT which forms the driver circuit in a concentration range of $1\times10^{20}$ to $1\times10^{21}$ atoms/cm$^3$;

process (C) for forming a region which includes a p-type impurity element in an active layer of a p-channel TFT which forms the driver circuit in a concentration range of $3\times10^{20}$ to $3\times10^{21}$ atoms/cm$^3$;

process (D) for forming a region which includes an n-type impurity region in an active layer of a pixel TFT which forms the pixel section in a concentration range of $1\times10^{16}$ to $5\times10^{18}$ atoms/cm$^3$, is characterized in that the process D is performed by adding an n-type impurity element by using as a mask a gate wiring that is covered by an insulating film comprising silicon.

Note that the order of each processes A to D may be appropriately altered. In this case, in whatever order the steps are carried out, the basic functions of the finally formed TFTs also remain unchanged; and thus, such change in the step order does not impair the effects of the invention.

BRIEF DESCRIPTION OF THE DRAWINGS

FIG. 1 is a diagram showing manufacturing processes of a pixel section and a driver circuit.

FIG. 2 is a diagram showing manufacturing processes of a pixel section and a driver circuit.

FIG. 3 is a diagram showing manufacturing processes of a pixel section and a driver circuit.

FIG. 4 is a diagram showing manufacturing processes of a pixel section and a driver circuit.

FIG. 5 is a cross sectional diagram of an active matrix liquid crystal display device.

FIG. 6 is a diagram showing a LDD structure of n-channel TFTs

FIG. 7 is a diagram showing a LDD structure of n-channel TFTs (pixel section)

FIG. 10 is a diagram showing a top view of a pixel section.

FIG. 11 is a diagram showing a cross-sectional structure and a top view of a pixel section.

FIG. 12 is a diagram showing a structure of storage capacitors.

FIG. 16 is a diagram showing manufacturing processes of a pixel section and a driver circuit.

FIG. 22 is a diagram showing circuit structures in a pixel section of an EL display device

FIG. 24 is a diagram showing examples of electric appliances.

FIG. 25 is a diagram showing the structure of an optical engine.

DETAILED DESCRIPTION OF THE PRESENT PREFERRED EMBODIMENTS

Figure 8:
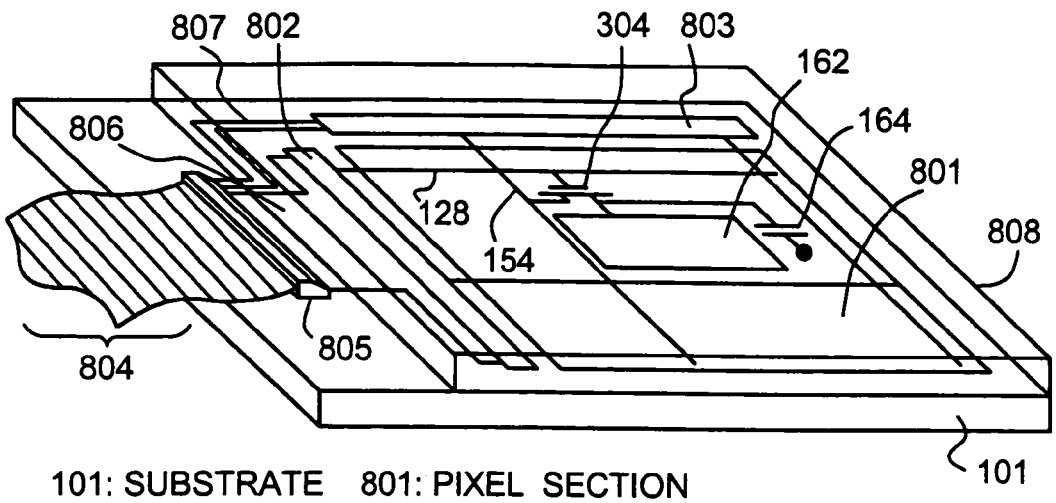
FIG. 8 is a perspective view of an active matrix liquid crystal display device.

The description of the embodiment modes of the present invention is performed in details by the embodiments shown below.

Embodiment 1

An Embodiment of the invention will now described referring to FIGS. 1 to 4. Here, the process of simultaneously fabricating a pixel section and a driver circuit for controlling the pixel section over a substrate is described. However, for simplicity of the description, a CMOS circuit that is the basic circuit of a shift register, a buffer, etc., and an n-channel type TFT forming a sampling circuit are shown for the driving circuits.

Referring to FIG. 1A, as a substrate 101, a quartz substrate or a silicon substrate is preferably used. A quartz substrate is used in the present embodiment. Besides, there may also be used a substrate formed with an insulation film on the surface of a metal substrate or a stainless steel substrate. in the case of the present embodiment the heat resistance durable to a temperature exceeding 800° C. is required, and any substrate may be used if the substrate satisfies the heat resistance.

A semiconductor film 102 including amorphous structure is formed on the surface on which TFTs are formed, through low pressure thermal CVD, plasma CVD or sputtering into 20 to 100 nm (preferably 40 to 80 nm). Note that though the amorphous silicon film is formed into 60 nm thickness in the present embodiment, this film thickness will not be the thickness of the active layers of the finally formed TFTs since there is subsequent thermal oxidation process.

An amorphous semiconductor film, a microcrystal semiconductor film, and, additionally, a compound semiconductor film that contains the amorphous structure, such as an amorphous silicon germanium film, are known as a semiconductor film that contains the amorphous structure. It is also effective to form a base film and the amorphous silicon film on the substrate continuously without air release. This allows contamination of the substrate surface to exert no influence upon the amorphous silicon film and allows the completed TFT to have lower characteristic variability.

Next, a mask film 103 formed of an insulating film that contains silicon is formed on an amorphous silicon film 102, and openings 104a and 104b are formed by patterning. These openings serve as an addition region for adding a catalyst element by which crystallization is promoted (accelerated) in the following crystallizing step. (FIG. 1A)

A silicon oxide film, a silicon nitride film, and a silicon oxynitride film can be used as the insulating film that contains silicon. The silicon oxynitride film is the insulating film that contains a predetermined amount of silicon, nitrogen, and oxygen and is designated as SiOxNy. The silicon oxynitride film can be formed by raw material gases of $SiH_4$, $N_2O$, and $NH_3$. The concentration of nitrogen contained therein may be from 25 atomic % to less than 50 atomic %.

Simultaneously with the patterning of the mask film 103, a marker pattern is formed which is used as a reference in a later patterning step. Amorphous silicon film 102 is slightly etched when etching the mask film 103, and this step can be used as a maker pattern in the later mask alignment.

Next, a semiconductor film that contains a crystal structure is formed according to a technique described in Japanese Patent Application Laid-open No. Hei 10-247735 (corresponding to U.S. patent application Ser. No. 09/034,041). The technique disclosed herein is a crystallizing means of using catalyst elements (one or plural elements selected from the group consisting of nickel, cobalt, germanium, tin, lead, palladium, iron, and copper) that promote crystallization when crystallizing a semiconductor film that contains an amorphous structure.

In more detail, heating process is performed with catalyst elements maintained on the surface of the semiconductor film that contains the amorphous structure, and thereafter the semiconductor film with the amorphous structure is changed into a semiconductor film that contains a crystal structure. A technique described in the first embodiment of Japanese Patent Application Laid-Open No. Hei 7-130652 may be used as the crystallizing means. Both a so-called monocrystalline semiconductor film and a polycrystalline semiconductor film are included in the semiconductor film that contains the crystalline structure. However, the semiconductor film that contains the crystal structure described in this publication has a grain boundary.

In this publication a spin coating is used when forming a layer that contains catalyst elements on a mask film. However, measures of depositing a thin film containing catalyst element using vapor phase method such as sputtering or evaporation may also be adopted.

Though it depends on hydrogen content in the amorphous silicon film, heat treatment at 400 to 550° C. for about one hour is preferably performed so as to perform crystallization after sufficiently reducing hydrogen. Preferably, in this case, the hydrogen content thereof is 5 atomic % or less.

In the crystallization process, heat treatment is first conducted at 400 to 500° C. for about one hour, hydrogen is then released from the film, and heat treatment is again conducted at 500 to 650° C. (preferably 550–600° C.) for 6 to 16 hours (preferably 8 to 14 hours).

In this embodiment, nickel is used as a catalyst element, and heat treatment is conducted at 570° C. for 14 hours. As a result, crystallization progresses in directions substantially parallel to the substrate (i.e., arrow directions in the figure) starting from the openings 104a, 104b, and, accordingly, semiconductor films (crystalline silicon films in this embodiment) 105a to 105d are formed which contain a crystal structure provided with macroscopically aligned crystal growth direction. (FIG. 1B)

Next, gettering process is performed for removing the nickel used in the crystallizing process from the crystalline silicon film. In this embodiment, while maintaining the previously formed mask film 103 as a mask, a process for adding an element that belongs to group 15 of the periodic table (phosphorus in this embodiment) is performed so as to form phosphorus added regions 106a and 106b including phosphorus (hereinafter, designated as gettering region) at the concentration of $1 \times 10^{19}$ to $1 \times 10^{20}$ atoms/cm$^3$ on the exposed crystalline silicon film at the openings 104a, 104b. (FIG. 1C)

Next, heat treatment is performed at 450 to 650° C. (preferably 500 to 550° C.) for 4 to 24 hours (preferably 6 to 12 hours) in a nitrogen atmosphere. The nickel in the crystalline silicon film moves in the direction of the arrow by this heat treatment, and is captured in the gettering regions 106a and 106b by the gettering action of the phosphorus. In other words, the nickel is removed from the crystalline silicon film, and therefore, the concentration of the nickel included in the crystalline silicon films 107a to 107d after the gettering process can be reduced to $1 \times 10^{17}$ atoms/cm$^3$ or less, preferably, to $1 \times 10^{16}$ atms/cm$^3$.

Subsequently, the mask film 103 is removed, and a protective film 108 is formed on the crystalline silicon films 107a to 107d for a later impurity addition process. A silicon oxynitride film or a silicon oxide film of 100 to 200 nm thick (preferably, 130 to 170 nm) may be used as the protective film 108. The protective film 108 serves to prevent the crystalline silicon film from being directly exposed to plasma when adding impurities and to control the minute concentration thereof.

Thereafter, a resist mask 109 is formed thereon, and an impurity element that imparts a p-type (hereinafter, designated as p-type impurity element) is added by interposing the protective film 108. As a p-type impurity element, representatively an element that belongs to group 13 of the periodic table and, typically, boron or gallium can be used. This process (called a channel doping process) is a process for controlling the threshold voltage of a TFT. Here, boron is added by ion doping using plasma excited diborane ($B_2H_6$) without mass-separation. Needless to say, an ion implantation method with mass-separation can be used.

According to this process, impurity regions 110a and 110b are formed, in which the p-type impurity element (in this embodiment, boron) at the concentration of $1 \times 10^{15}$ to $1 \times 10^{18}$ atoms/cm$^3$ (representatively, $5 \times 10^{16}$ to $5 \times 10^{17}$ atoms/cm$^3$) is included. In this specification, the impurity region (including no phosphorus) that includes the p-type impurity element within the range of the aforementioned concentration is defined as a p-type impurity region (b). (FIG. 1D)

Subsequently, the resist mask 109 is removed, and then the crystalline silicon film undergoes patterning so as to form island semiconductor layers 111 to 114 (hereinafter, designated as active layer). By selectively adding the nickel and undergoing crystallization, the active layers 111 to 114 are formed with much superior crystalline silicon films in crystallinity. Specifically, it has a crystal structure in which bar-shaped or column-shaped crystals are arranged in a specific direction. Further the nickel is removed or decreased after crystallization by the gettering action of phosphorus, so that the concentration of the catalyst element that remains in the active layers 111 to 114 is $1 \times 10^{17}$ atoms/cm$^3$ or less, preferably, $1 \times 10^{16}$ atoms/cm$^3$. (FIG. 1E)

The active layer 111 of a p-channel TFT is a region that does not include intentionally added impurity element, and the active layers 112 to 114 of an n-channel TFT are p-type impurity regions (b). In this specification, the active layers 111 to 114 in this state are all defined as intrinsic or substantially intrinsic. In other words, the region to which an impurity element is intentionally added to such an extent that the TFT can work smoothly can be regarded as a substantially intrinsic region.

Subsequently, an insulating film that contains silicon is formed into 10 to 100 nm thickness by plasma CVD or sputtering. In this embodiment, a silicon oxynitride film is formed into 30 nm thickness. This insulating film that contains silicon can be used in the form of a single layer or lamination layer of another insulating film that contains silicon.

Thereafter, heat treatment process is performed at a temperature between 800 and 1150° C. (preferably 900 and 1000° C.) for 15 minutes to 8 hours preferably, 30 minutes to 2 hours) in an oxidizing atmosphere (thermal oxidation process). In this embodiment, heat treatment process is performed at 950° C. for 80 minutes in an atmosphere where hydrogen chloride of 3 volume % is added to an oxygen atmosphere. The boron added in the process of FIG. 1D is activated during the thermal oxidation process. (FIG. 2A)

Note that either dry oxygen atmosphere or wet oxygen atmosphere is acceptable as the oxidizing atmosphere, dry oxygen atmosphere is suitable for decreasing crystal defects in a semiconductor layer. Further, though an atmosphere that includes a halogen element in an oxygen atmosphere is adopted in the present embodiment, it is acceptable to perform in 100% oxygen atmosphere.

During the thermal oxidation process, an oxidation reaction progresses also at an interface between the insulating film that contains silicon and the active layers 111 to 114 underneath. By taking that into consideration the film thickness of a finally formed gate insulating film 115 is adjusted to be 50 to 200 nm (preferably, 100 to 150 nm) in the present embodiment. In the thermal oxidation process of this embodiment, 25 nm out of the active layer 60 nm thick is oxidized, and accordingly, the film thickness of the active layers 111 to 114 becomes 45 nm. Additionally, 50 nm thick thermal oxidation film is added to a 30 nm-thick insulating film that contains silicon, and the film thickness of the final gate insulating film 115 becomes 110 nm.

Thereafter, resist masks 116 to 119 are newly formed. Impurity regions 120 to 122 that impart an n-type are then formed by adding an impurity element that gives the n-type (hereinafter, referred to as n-type impurity element). Representatively an element that belongs to group 15 of the periodic table, typically, phosphorus or arsenic can be used as the n-type impurity element. (FIG. 2B)

The impurity regions 120 to 122 are to serve as LDD region in n-channel type TFT of CMOS circuit and a sampling circuit in a later stage. The n-type impurity element is included in the impurity region formed herein at a concentration between $2 \times 10^{16}$ and $5 \times 10^{19}$ atoms/cm$^3$ ($5 \times 10^{17}$ to $5 \times 10^{18}$ atoms/cm$^3$ representatively). In this specification, the impurity region that includes the n-type impurity element within the range of the aforementioned concentration is defined as n-type impurity region (b).

Herein, phosphorus is added at a concentration of $1\times10^{18}$ atoms/cm$^3$ by ion doping in which phosphine (PH$_3$) undergoes plasma excitation without mass separation. Needless to say, ion implantation that performs the mass separation can also be used. In this process, phosphorus is added to the crystalline silicon film through by interposing the gate film 115.

Heat treatment is next performed in an inert atmosphere of 600 to 1000° C. (preferably 700 to 800° C.), and thereby, the phosphorus added in the process of FIG. 2B is activated. In this embodiment, the heat treatment is performed at 800° C. for 1 hour in a nitrogen atmosphere. (FIG. 2C)

At this time, it is possible to restore the interface between the active layers and the gate insulating film and restore the active layer damaged when phosphorus is added, simultaneously. It is preferable to, conduct furnace annealing that uses an electric furnace for this activating process, but light annealing, such as lamp annealing or laser annealing, can be conducted together therewith.

This process makes clear a junction with a boundary portion of the n-type impurity regions (b) 120 to 122, namely, an intrinsic or substantially intrinsic region (it is needless to say that a p-type impurity region (b) is also included therein) that exists around the n-type impurity regions (b). This means that the LDD region and the channel formation region can form a very excellent junction when the TFT is completed later.

Thereafter, a conductive film that serves as a gate wiring is formed. Though the gate wiring can be formed with a single-layer conductive film, a lamination film, such as two-layer or three-layer film, is preferably used if necessary. In this embodiment, a lamination film with first conductive film 123 and second conductive film 124 are formed. (FIG. 2D)

Herein, as the first conductive film 123 and the second conductive film 124, a conductive film of an element selected from the group consisting of tantalum (Ta), titanium (Ti), molybdenum (Mo), tungsten (W), chrome (Cr), and silicon (Si), or a conductive film of a conductive film mainly composed of the aforementioned element (tantalum nitride film, tungsten nitride film, and titanium nitride film, representatively), or an alloy film of a combination of the aforementioned elements (Mo—W alloy film, Mo—Ta alloy film, and tungsten silicide film, representatively) can be used.

The first conductive film 123 may be 10 to 50 nm thick (20 to 30 nm, preferably), and the second conductive film 124 may be 200 to 400 nm thick (preferably 250 to 350 nm). In this embodiment, a tungsten nitride (WN) film of 50 nm thickness is used as the first conductive film 123, and a tungsten film of 350 nm thickness is used as the second conductive film 124. Though not shown in the figure, it is effective to form a silicon film to about 2 to 20 nm thick on or under the first conductive film 123. As a result, it is possible to improve the adhesive properties of the conductive film formed thereon and achieve antioxidation.

It is also effective to use a tantalum nitride film as the first conductive film 123, and a tantalum film as the second conductive film.

Thereafter, gate wirings 125 to 128 are formed into 400 nm thickness by etching the first conductive film 123 and the second conductive film 124 together. At this time, the gate wirings 126 and 127 of n-channel TFTs in the driving circuit are formed partially overlap the n-type impurity regions (b) 120 to 122 by interposing the gate insulating film 115. This overlapped portion later turns to a Lov region. (FIG. 2E)

Next, a resist mask 129 is formed, and a p-type impurity element (in this embodiment, boron) is added to form impurity regions 130 and 131 containing boron at a high concentration. In this embodiment, boron is added at a concentration of $3\times10^{20}$ to $3\times10^{21}$ atoms/cm$^3$ (typically $5\times10^{20}$ to $1\times10^{21}$ atoms/cm$^3$) by an ion doping method using diborane (B$_2$H$_6$) (of course, an ion implantation method may be used). In the present specification, an impurity region containing a p-type impurity element in the foregoing concentration range is defined as a p-type impurity region (a) (FIG. 3A).

Next, the resist mask 129 is removed, and resist masks 132 to 134 are formed to cover gate wiring lines and regions which becomes o-channel TFTs. Then, an n-type impurity element (in this embodiment, phosphorus) is added to form impurity regions 135 to 141 containing phosphorus at a high concentration. Also in this step, an ion doping method using phosphine (PH$_3$) (of course, an ion implantation method may be used) is used, and the concentration of phosphorus in the regions is made $1\times10^{20}$ to $1\times10^{21}$ atoms/cm$^3$ (typically, $2\times10^{20}$ to $5\times10^{21}$ atoms/cm$^3$) (FIG. 3B).

Note that in the present specification, an impurity region containing an n-type impurity element in the foregoing concentration range is defined as an n-type impurity region (a). Although phosphorus or boron already added in the previous step is contained in the regions where the impurity regions 135 to 141 are formed, since phosphorus is added at a sufficiently high concentration, it is not necessary to consider the influence of phosphorus or boron added in the previous step. Thus, it is permissible to reword the impurity regions 135 to 141 as n-type impurity regions (a).

Next, the resist masks 132 to 134 are removed, and a cap film 142 made of an insulating film containing silicon is formed. It is appropriate that its thickness is made 25 to 100 nm (preferably 30 to 50 nm). In this embodiment, a silicon nitride film having a thickness of 25 nm is used. Although the cap film 142 functions also as a protective film to prevent oxidation of the gate wiring lines in a subsequent activation step, if the film is made too thick, stress becomes strong and disadvantage such as film peeling occurs, so that it is preferable that the thickness is made 100 nm or less.

Next, an n-type impurity element (in this embodiment, phosphorus) is added in a self-aligning manner with the gate wiring lines 125 to 128 as masks. Adjustment is made so that phosphorus is added in impurity regions 143 to 146 thus formed at a concentration of ½ to ¹⁄₁₀ (typically ⅓ to ¼) of that of the n-type impurity region (b) (however, the concentration is 5 to 10 times as high as the concentration of boron added in the foregoing channel doping step, typically $1\times10^{16}$ to $5\times10^{18}$ atoms/cm$^3$, and exemplarily $3\times10^{17}$ to $3\times10^{18}$ atoms/cm$^3$ that in the present specification, an impurity region (except for the p-type impurity region (a)) containing an n-type impurity element in the above concentration range is defined as an n-type impurity region (c) (FIG. 3C).

In this step, phosphorus is added through the insulating film (laminate film of the cap film 142 and the gate insulating film 115) having a thickness of 105 nm, and the cap films formed on side walls of the gate wiring lines 134a and 134b also function as masks. That is, an offset region with a length equal to the thickness of the cap film 142 is formed. Note that the term "offset region" indicates a high resistance region which is formed to be in contact with a channel forming region and is formed of a semiconductor film having the same composition as the channel forming region, but which does not form an inversion layer (channel forming region) since a gate voltage is not applied. In order to lower an OFF current value, it is important to suppress the overlap of an LDD region and a gate wiring line to the utmost, and in that meaning, it can be said that to provide the offset region is effective.

Note that as in this embodiment, in the case where the channel forming region also contains the p-type impurity element at a concentration of $1\times10^{15}$ to $1\times10^{18}$ atoms/cm$^3$, naturally, the offset region also contains the p-type impurity element at the same concentration.

Although the length of the offset region is determined by the thickness of the cap film actually formed on the side wall of the gate wiring line and a going around phenomenon (phenomenon in which an impurity is added so as to get into a region under a mask) at the time of adding the impurity element, from the viewpoint of suppressing the overlap of the LDD region and the gate wiring line, it is very effective to form the cap film in advance at the time of forming the n-type impurity region (c) as in this embodiment.

Note that in this step, although phosphorus is added at a concentration of $1\times10^{16}$ to $5\times10^{18}$ atoms/cm$^3$ in all impurity regions except portions hidden by the gate wiring lines, since the concentration is very low, it does not have an influence on the function of each impurity region. Although boron has been added at a concentration of $1\times10^{15}$ to $1\times10^{18}$ atoms/cm$^3$ in the n-type impurity regions (b) 143 to 146 in the channel doping step, since phosphorus is added in this step at a concentration 5 to 10 times as high as that of boron contained in the p-type impurity regions (b), also in this case, it can be said that boron does not have an influence on the function of the n-type impurity regions (b).

However, strictly speaking, in the n-type impurity regions (b) 147 and 148, the concentration of phosphorus in the portion overlapping with the gate wiring line remains $2\times10^{16}$ to $5\times10^{19}$ atoms/cm$^3$, while in the portion not overlapping with the gate wiring line, phosphorus of a concentration of $1\times10^{16}$ to $5\times10^{18}$ atoms/cm$^3$ is added to that, and the portion contains phosphorus at a slightly higher concentration.

Next, a first interlayer insulating film 149 is formed. The first interlayer insulating film 149 may be formed of an insulating film containing silicon, specifically a silicon nitride film, a silicon oxide film, a silicon oxynitride film, or a laminate film of combination of those. It is appropriate that its thickness is made 100 to 400 nm. In this embodiment, a silicon oxynitride film (nitrogen concentration is 25 to 50 atomic %) having a thickness of 200 nm is formed by plasma CVD using SiH$_4$, N$_2$O, and NH$_3$ as raw material gases.

Thereafter, a heat treatment step for activating the n-type and p-type impurity elements added at each concentration is carried out. This step can be carried out by using a furnace annealing, laser annealing, lamp annealing method or a combination of those. In the case where this step is carried out by furnace annealing, it is appropriate that the step is carried out in an inert gas atmosphere at 500 to 800° C., preferably 550 to 600° C. In this embodiment, a heat treatment at 600° C. for 4 hours is carried out, so that the impurity elements are activated (FIG. 3D).

Note that in this embodiment, the gate wiring lines are covered in the state where the silicon nitride film 142 and the silicon nitride oxide film 149 are laminated, and the activation step is carried out in that state. In this embodiment, although tungsten is used as a wiring line material, it is known that a tungsten film is very weak to oxidation. That is, even if oxidation is made while the tungsten film is covered with a protective film, if a pinhole exists in the protective film, it is immediately oxidized. However, in this embodiment, the silicon nitride film extremely effective as an oxidation resistant film is used, and the silicon oxynitride film is laminated to the silicon nitride film, so that it is possible to carry out the activation step at a high temperature without paying attention to the problem of the pinhole on the silicon nitride film.

Next, after the activation step, a heat treatment at 300 to 450° C. for 1 to 4 hours is carried out in an atmosphere containing hydrogen of 3 to 100% to hydrogenate the active layers. This step is a step of terminating dangling bonds of a semiconductor layer by thermally excited hydrogen. As other means for hydrogenating, plasma hydrogenating (using hydrogen excited by plasma) may be carried out.

When the activation step is ended, a second interlayer insulating film 150 having a thickness of 500 nm to 1.5 µm is formed on the first interlayer insulating film 149. In this embodiment, as the second interlayer insulating film 150, a silicon oxide film having a thickness of 800 nm is formed by plasma CVD. In this way, an interlayer insulating film made of a laminate film of the first interlayer insulating film (silicon oxynitride film) 149 and the second interlayer insulating film (silicon oxide film) 150 and having a thickness of 1 µm is formed.

If there is no problem in view of heat resistance in a subsequent step, as the second interlayer insulating film 150, it is also possible to use an organic resin film of polyimide, acrylic, polyamide, polyimideamide, BCB (benzocyclobutene), or the like.

Thereafter, contact holes reaching a source region or drain region of each TFT are formed, and source wiring lines 151 to 154 and drain wiring lines 155 to 157 are formed. Note that in order to form the CMOS circuit, the drain wiring line 155 is made common between the p-channel TFT and n-channel TFT. Although not shown, in this embodiment, this wiring line is made a laminate film of three-layer structure in which a Ti film having a thickness of 200 nm, an aluminum film containing Ti and having a thickness of 500 nm, and a Ti film having a thickness of 100 nm are continuously formed by sputtering. Note that copper wiring and titanium nitride wiring may be laminated as a source wiring or a drain wiring. (FIG. 4A)

Next, as a passivation film 158, a silicon nitride film, a silicon oxide film, or a silicon oxynitride film having a thickness of 50 to 500 nm (typically 200 to 300 nm) is formed. At this time, in this embodiment, prior to formation of the film, a plasma treatment is carried out by using a gas containing hydrogen, such as H$_2$ or NH$_3$, and a heat treatment is carried out after film formation. Hydrogen excited by this pre-treatment is supplied to the first and second interlayer insulating films. By carrying out the heat treatment in this state, the film quality of the passivation film 158 is improved, and since hydrogen added in the first and second interlayer insulating films is diffused to a lower layer side, the active layers can be effectively hydrogenated.

Besides, after the passivation film 158 is formed, a hydrogenating step may be further carried out. For example, it is appropriate that a heat treatment at 300 to 450° C. for 1 to 12 hours is carried out in an atmosphere containing hydrogen of 3 to 100%, or the same effect can be obtained if a plasma hydrogenating method is used. Note that at a position where a contact hole for connecting a pixel electrode with a drain wiring Fine is to be formed after the hydrogenating step, an opening section (not shown) may be formed in the passivation film 158.

Thereafter, a third interlayer insulating film 159 comprising organic resin is formed into approximately 1 µm thickness. As the organic resin, polyimide, acrylic, polyamide, polyimideamide, BCB (benzocyclobutene) or the like may be used. As the merits of using the organic resin film, it is possible to enumerate such points that a film formation method is simple, parasitic capacitance can be reduced since a relative dielectric constant is low, and the film is excellent in flatness. Note that it is also possible to use a film of organic resin other than those stated above, an organic SiO compound, or the like. Here, polyimide of a type in which thermal polymerization is made after application to the substrate is used, and is fired at 300° C. to form the film.

Next, in a region which becomes a pixel section, a shielding film 160 is formed on the third interlayer insulating film 159. In the present specification, the term "shielding film" is used to mean shielding light and electromagnetic wave. The shielding film 160 is formed of a film comprising an element selected from aluminum (Al), titanium (Ti), and tantalum (Ta), or a film containing any one element as its main ingredient into a thickness of 100 to 300 nm. In this embodiment, an aluminum film containing titanium of 1 wt % is formed to a thickness of 125 nm.

Note that when an insulating film, such as a silicon oxide film, having a thickness of 5 to 50 nm is formed on the third interlayer insulating film 159, the adhesiveness of a shielding film formed thereon can be raised. Further, when a plasma treatment using a $CF_4$ gas is performed on the surface of the third interlayer insulating film 159 made of organic resin, the adhesiveness of a shielding film formed on the film can be improved by the surface refinement.

Besides, by using this aluminum film containing titanium, other connection wiring lines can also be formed in addition to the shielding film. For example, a connection wiring line connecting circuits in the driver circuit can be formed. However, in that case, before the film is formed of material for forming the shielding film or the connection wiring line, it is necessary to form a contact hole in the third interlayer insulating film in advance.

Next, an oxide 161 having a thickness of 20 to 100 nm (preferably 30 to 50 nm) is formed on the surface of the shielding film 160 by an anodic oxidation method or plasma oxidation method (in this embodiment, the anodic oxidation method). In this embodiment, since the film containing aluminum as its main ingredient is used as the shielding film 160, an aluminum oxide film (alumina film) is formed as the anodic oxide 161.

At the anodic oxidation treatment, first, a tartaric acid ethylene glycol solution having a sufficiently low alkaline ion concentration is prepared. This is a solution of a mixture of 15% of tartaric acid ammonium solution and ethylene glycol at a ratio of 2:8, and ammonia water is added to this, so that pH is adjusted to become 7±0.5. Then, a platinum electrode which becomes a cathode is provided in this solution, the substrate on which the shielding film 160 is formed is immersed in the solution, and a constant (several mA to several tens mA) dc current is made flow with the shielding film 160 as an anode.

Although the voltage between the cathode and the anode in the solution is changed with a time in accordance with the growth of the anodic oxidation, the voltage is raised at a voltage rising rate of 100 V/min while constant current is kept, and when the voltage reaches an attained voltage of 45 V, the anodic oxidation treatment is ended. In this way, the anodic oxide 161 having a thickness of about 50 nm can be formed on the surface of the shielding film 160. As a result, the thickness of the shielding film 160 becomes 90 nm. Note that the numerical values relative to the anodic oxidation shown here are merely examples, and optimum values are naturally changed according to the size of a fabricated device or the like.

Besides, here, although such a structure is adopted that the insulating film is provided only on the surface of the shielding film by using the anodic oxidation method, the insulating film may be formed by a vapor phase method such as plasma CVD, thermal CVD, or sputtering. Also in that case, it is preferable that the thickness is made 20 to 100 nm (preferably 30 to 50 nm). Besides, a silicon oxide film, a silicon nitride film, a silicon oxynitride film, a DLC (Diamond like carbon) film, a tantalum oxide film, or an organic resin film may be used. Further, a laminate film of a combination of these may be used.

Next, contact holes reaching the drain wiring line 157 is formed in the third interlayer insulating film 159 and the passivation film 158, and a pixel electrode 162 is formed. Note that a pixel electrode 163 is a pixel electrode of an adjacent different pixel. As for the pixel electrodes 162 and 163, it is appropriate that a transparent conductive film is used in the case where a transmission type liquid crystal display device is formed, and a metal film is used in the case where a reflection type liquid crystal display device is formed. Here, in order to form the transmission type liquid crystal display device, an indium-tin oxide (referred to as ITO) film having a thickness of 110 nm is formed by sputtering.

At this time, the pixel electrode 162 and the shielding film 160 overlap with each other through the anodic oxide 161, and holding capacitance (capacitance storage) 164 is formed. In this case, it is desirable that the shielding film 160 is set to a floating state (electrically isolated state) or a fixed potential, preferably a common potential (intermediate potential of an image signal transmitted as data).

In this way, the active matrix substrate including the driver circuit and the pixel section on the same substrate is completed. Note that in FIG. 4B, a p-channel TFT 301, and n-channel TFTs 302 and 303 are formed in the driver circuit, and a pixel TFT 304 made of an n-channel TFT is formed in the pixel section.

In the p-channel TFT 301 of the driver circuit, a channel forming region 201, and a source region 202 and a drain region 203 are respectively formed by the p-type impurity regions (a). Strictly speaking however, source region 202 and drain region 203 include phosphorus at a concentration between $1\times10^{16}$ to $5\times10^{18}$ atoms/cm$^3$.

Further, in the n-channel TFT 302, a channel forming region 204, a source region 205, a drain region 206 and a LDD region that overlaps a gate wiring by interposing a gate insulating film in between the channel forming region and the drain region (in this specification, such a region will be called Lov, wherein ov is suffixed as having the meaning of overlap) 207 are formed. In this case, the Lov region 207 was formed so as to contain phosphorus at a concentration of $2\times10^{16}$ to $5\times10^{19}$ atoms/cm$^3$ and wholly overlap the gate wiring.

Further, in case of FIG. 4B, the Lov region is disposed only on one side (only at the drain region side) of the channel forming region 204 in order to reduce the resistance component as much as possible, but Lov regions may also be disposed on both sides of the channel forming region 204.

Further, in the n-channel TFT 303, a channel forming region 208, a source region 209 and a drain region 210 are formed, and further, LDD regions 211 and 212 are formed to sandwich the channel forming region. Namely, LDD regions are formed between the source region and the channel forming region, and between the drain region and the channel forming region.

In case of this structure, because a part of the LDD regions 211 and 212 are disposed so as to overlap the gate wiring, so that the regions (Lov) regions overlapping the gate wiring through the gate insulating film and the regions which do not overlap the gate wiring (in this specification, such regions will be referred to as Loff regions, wherein off is added as a suffix meaning offset) are realized.

Here, the sectional view shown in FIG. 6 is an enlarged view showing the state in which the n-channel TFT 303 shown in FIG. 4B is fabricated up to the step shown in FIG. 3C. As shown here, the LDD region 211 can be further divided into a Lov region 211a and a Loff region 211b. Further, in the Lov region 211a, phosphorus is contained at a concentration of $2 \times 10^{16}$ to $5 \times 10^{19}$ atoms/cm$^3$, while, in the Loff region 211b, phosphorus is contained at a concentration 1 to 2 times as high (generally, 1.2 to 1.5 times as high) as the phosphorus concentration of the Lov region 211a.

Further, in the pixel TFT 304, there were formed channel forming regions 213 and 214, a source region 215, a drain region 216, Loff regions 217 to 220 and an n-type impurity region (a) 221 adjacent to the Loff regions 218 and 219. In this case, the source region 215 and the drain region 216 are respectively formed of n-type impurity regions (a), and the Loff regions 117 to 220 are formed of n-type impurity regions (c).

In this Embodiment, the structures of the TFTs forming the respective circuits could be optimized in accordance with the circuit specifications required by the pixel section and the driver circuits, and the operation performance and reliability of the semiconductor device can be enhanced. More specifically, disposition of the LDD regions are varied in accordance with the circuit specifications in n-channel TFTs, and the Lov regions or the Loff regions are properly used respectively, whereby a TFT structure made by attaching importance to high-speed operation and to counter measures to the hot carriers, and a TFT structure made by attaching importance to low OFF-current operation, were realized over a substrate.

For example, in case of an active matrix type liquid crystal display device, the n-channel type TFT 302 is suited to a driver circuit such as a shift register, a frequency dividing circuit, a signal splitting circuit, a level shifter or a buffer wherein importance is attached to high-speed operation. Namely, by disposing a Lov region only on the drain region side of the channel forming region, a structure in which importance is attached to the measure for coping with the hot carriers is established while reducing the resistance component as possible. This is because, in case of the group of circuits mentioned above, the function of the source region and the drain region do not change, and the direction in which the carriers (electrons) move is fixed.

However, it is possible to dispose Lov regions to interpose the channel forming region as required. Namely, it is possible to form them in between the source region and the channel forming region, and in between the drain region and the channel forming region.

Further, the n-channel type TFT 303 is suited to a sampling circuit (also called a transfer gate) wherein importance is attached to both the measure to cope with the hot carriers and low OFF-current operation. Namely, by disposing Lov regions, a measure to cope with the hot carriers is taken, and, by disposing Loff regions, a low OFF-current operation was realized. Further, in case of a sampling circuit, the function of the source region and the drain region is inverted to change the moving direction of the carriers by 180°, so that such a structure as to become line-symmetrical with respect to the gate wiring must be employed. In some cases, it is also feasible that only the Lov regions are provided:

Further, the n-channel TFT 304 is suited to a pixel section or a sampling circuit wherein importance is attached to low OFF-current operation. Namely, a Lov region which can become a cause for increasing the OFF-current value is not provided, but only Loff regions are provided, whereby a low OFF-current operation is realized. Further, by using, as the Loff regions, LDD regions having a concentration lower than that of the LDD regions in the driver circuits, there is taken the measure to ensure that, even if the ON-current value somewhat falls, the OFF-current value is thoroughly reduced. Further, it is confirmed that the n-type impurity region (a) 221 is very effective in reducing the OFF-current value.

Further, with respect to the channel length of 3 to 7 μm, the length (width) of the Lov region 207 in the n-channel TFT 302 may be set to 0.3 to 3.0 μm, typically 0.5 to 1.5 μm. Further, the length (width) of the Lov regions 211a and 212a in the n-channel TFT 303 may be set to 0.3 to 3.0 μm, typically 0.5 to 1.5 μm, and the length (width) of the Loff regions 211b and 212b may be set to 1.0 to 3.5 μm, typically 1.5 to 2.0 μm. Further, the length (width) of the Loff regions 217 to 220 provided in the pixel TFT 304 may be set to 0.5 to 3.5 μm, typically 2.0 to 2.5 μm.

Further, the p-channel type TFT 301 is formed in a self-alignment manner, while the n-channel type TFTs 302 to 304 are formed in a non-self-alignment manner; this point is also a feature of the present invention.

Further, in this Embodiment, as the dielectric of the capacitance storage, an alumina film having a high relative dielectric constant of 7 to 9 was used, whereby the area for forming the required capacitance could be reduced. Further, by using as one electrode of the capacitance storage the shielding film formed on the pixel TFT as in case of this Embodiment, the aperture ratio of the image display section of the active matrix type liquid crystal display device could be enhanced.

Note that the invention need not be limited to the structure of the storage capacitance set forth in this Embodiment. For example, it is also possible to use the storage capacitance structure disclosed in Japanese Patent Application No. Hei 9-316567, Japanese Patent Application No. Hei 9-273444 or Japanese Patent Application No. Hei 10-254097 filed by the present applicant.

The steps of fabricating an active matrix type liquid crystal display device from the active matrix substrate are described here. As shown in FIG. 5, an alignment film 501 is formed on the substrate in the state shown in FIG. 4B. In this Embodiment, a polyimide film was used as the alignment film. Further, an opposite electrode 503 comprising a transparent conductive film and an alignment film 504 are formed on an opposite substrate 502. Further, a color filter and a shielding film may be formed on the opposite substrate as required.

Next, after the formation of the alignment film, a rubbing treatment is performed so that the liquid crystal molecules are adjusted to orient with a fixed pre-tilt angle. Then the active matrix substrate on which the pixel section and the driver circuits are formed, and the opposite substrate are stuck together through a sealing material and a spacer (Neither of them is shown) by a known cell assembly process. Thereafter, a liquid crystal 505 is injected between the two substrates and perfectly sealed by a sealing material (not shown). As the liquid crystal, a known liquid crystal material may be used. In this way, the active matrix type liquid crystal display device shown in FIG. 5 is completed.

Next, the constitution of this active matrix liquid crystal display device will be described by referring to the perspective view shown in FIG. 8. In FIG. 8, the reference numerals common to those used in FIGS. 1 to 4 are used for associating FIG. 8 with the structural sectional views shown in FIGS. 1 to 4. The active matrix substrate comprises a pixel section 801, a scanning (gate) signal driving circuit 802, an image (source) signal driving circuit 803 that are formed over a quartz substrate 101. The pixel TFT 304 in the pixel section is an n-channel TFT, and the driving circuits provided in its peripheral are basically formed from a CMOS circuit. The scanning signal driving circuit 802 and the image signal driving circuit 803 are connected to the pixel section 801 through the gate wiring 128 and the source wiring 154, respectively. Further, a terminal 805 to which a FPC 804 is connected and the driving circuits are electrically connected by interconnection wirings 806 and 807.

Figure 9:
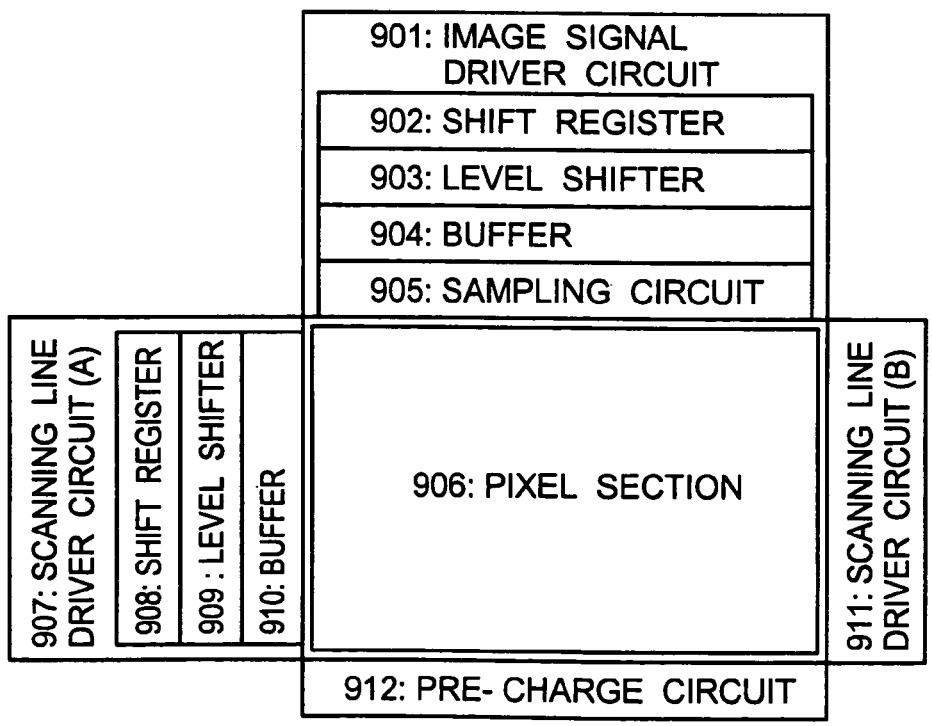
FIG. 9 is a circuit block diagram of an active matrix liquid crystal display device.

An example of the circuit arrangement of the active matrix liquid crystal display device shown in FIG. 8 is next shown in FIG. 9. The active matrix liquid crystal display device according to this Embodiment comprises an image signal driving circuit 901, a scanning signal driving circuit (A) 907, a scanning signal driving circuit (B) 911, a precharge circuit 912 and a pixel portion 906. In this specification, driving circuit includes the image signal driving circuit 901 and the scanning signal driving circuit 907.

The image signal driving circuit 901 comprises a shift register 902, a level shifter 903, a buffer 904, and a sampling circuit 905. Further, the scanning signal driving circuit (A) 907 comprises a shift register 908, a level shifter 909, and a buffer 910. The scanning signal driving circuit (B) 911 is of the similar structure.

Here, the driving voltage of the shift registers 902 and 908 is 3.55 to 16 V (typically 5V or 10V), and the structure shown by 302 in FIG. 4B is suited as the n-channel TFT used in the CMOS circuit forming each of these circuits.

Further, as each of the level shifters 903 and 909 and the buffers 904 and 910, a CMOS circuit including the n-channel type TFT 302 shown in FIG. 4B is suited like as the shift registers, though the driving voltage becomes so high as 14 to 16 V. It is effective to form the gate wiring into a multi-gate structure such as a double gate structure or a triple gate structure, in view of enhancing the reliability of the respective circuits.

Further, the driving voltage of a sampling circuit 905 is 14 to 16 V, but the source region and the drain region are inverted, and in addition, it is necessary to reduce the OFF-current value, so that a CMOS circuit including the n-channel type TFT 303 shown in FIG. 4B is suited as the sampling circuit 705. Though only n-channel type TFT is shown in FIG. 4B, it is preferable to actually form the sampling circuit by combining an n-channel TFT and a p-channel TFT so that large electric current can be flown.

Further, the driving voltage of the pixel section 906 is 14 to 16 V, and its OFF-current value is required to be further lower than that of the sampling circuit 905, so that the pixel section is desirably rendered into a structure in which no Lov region is disposed; and thus, the n-channel type TFT 304 shown in FIG. 4B is desirably used as the pixel TFT.

The most significant characteristic in the present invention is that an offset region exists between a LDD region and a channel forming region of a pixel TFT. This is described by using FIG. 7. FIG. 7 is an enlarged cross-sectional diagram of a portion of a pixel TFT which has gone through the processes up to FIG. 3C.

In case of manufacturing pixel TFT in accordance with the manufacturing processes of the present Embodiment, an offset region 701 (or 702) exists between the channel forming region 214 and the LDD region 220 (or 219) that is formed from n-type impurity region (c). The length of thi offset region 701 approximately coincides with the film thickness of the cap film 142 (strictly speaking, the film thickness referred here is the thickness of the portion formed on the side wall of the gate wiring).

Needless to say however, the length of the offset region 701 shortens than the thickness of the cap film 142 by the going around at phosphorus addition.

The length of the offset regions 701 and 702 is set at between 0 and 200 nm (preferably 20 to 100 nm) in the present invention. This length can be controlled by adjusting the thickness of the cap film 142.

As stated above, it is possible to make the OFF current value at an extremely low value in the present invention because 2 resistance regions of LDD region and offset region are disposed with respect to a pixel TFT. In other words, when a TFT is in a completely OFF state like as the voltage between the source and drain is 14V and the gate voltage is −17.5V, an OFF current value of 5 pA or less (preferably 1 pA or less) can be achieved.

Note that the constitutions of the present embodiment are easily realized by manufacturing TFTs in accordance with the processes shown in FIGS. 1 to 4. Further, although, in this Embodiment, the structure of only the pixel section and the driving circuit is shown, but, in accordance with the fabrication steps of Embodiment 1, it is also possible to form, beside the above, a signal splitting circuit, a frequency dividing circuit, a D/A converter circuit, an operational amplifier circuit, a gamma-correction circuit, and in addition, signal processing circuits (which may also be referred to as logic circuits) such as a memory circuit and a microprocessor circuit, on one and the same substrate.

As stated above, according to the present invention, a semiconductor device including a pixel section and driving circuits for controlling the pixel section, such as, e.g., a semiconductor device comprising a driving circuit section and a pixel section on one and the same substrate can be realized.

Additionally, if the processes described up to FIG. 2B in this embodiment are performed, there is formed a crystalline silicon film of a peculiar crystal structure with continuity in a crystal lattice. Japanese Patent Application Nos. Hei 10-044659, Hei 10-152316, Hei 10-152308 or 10-152305 filed by the present Applicant may be referred regarding the details of such crystalline silicon film. A brief description will be provided hereinafter of a feature of the crystal structure which the present applicant experimentally studied. This feature coincides with a feature of the semiconductor layer forming the active layer of the TFT that has been completed by this embodiment.

The above stated crystalline silicon film has a crystal structure in which a plurality of needle-like or bar-like crystals (hereinafter simply referred to as bar-like crystal) are gathered and placed side by side when seen microscopically. This can be easily confirmed by observation by TEM (transmission electron microscope).

Further, it has been verified by using electron beam diffraction and x-ray diffraction that the surface of the crystalline silicon film (sections where the channel forming regions are formed) have a {110} face as an orientation face although there is some crystal axis deviation. When analysis is performed by using electron beam diffraction it is found that the diffraction spots appeared cleanly in correspondence to the {110} face. Further, it is visible that each spot had a concentric distribution.

Furthermore, when the crystal grain boundaries formed by contact of each of bar-like crystals is observed by using an HR-TEM (high resolution transmission electron microscope), it is confirmed that the crystal lattice has continuity in the crystal grain boundaries. This is easily verified by the continuous connection of the observed lattice stripes in the grain boundaries.

Note that the continuity of the crystal lattice in the crystal grain boundaries originates in the fact that the crystal grain boundaries are grain boundaries that are referred to as "planar boundary." The definition of the planar boundary in this specification is 'planar boundary' described in "Characterization of High-Efficiency Cast-Si Solar Cell Wafers by MBIC Measurement, Ryuichi Shimokawa and Yutaka Hayashi, Japanese Journal of Applied Physics vol. 27, No. 5, pp. 751–8, 1988."

According to the above paper, planar boundary include twin crystal grain boundaries, special stacking faults, special twist grain boundaries, etc. This planar boundary possesses a characteristic in that it is electrically inactive. Namely, the crystal grain boundaries can essentially be seen as nonexistent because they do not function as a trap that obstructs the movement of a carrier though they are crystal grain boundaries.

Particularly for cases in which the crystal axis (the axis perpendicular to the crystal face) is the <110> axis, {211} twin crystal grain boundaries is also referred to as grain boundaries corresponding to $\Sigma 3$. The $\Sigma$ value is a parameter that indicates the degree of matching in corresponding grain boundaries, and it is known that smaller $\Sigma$ values signify good grain boundary matching.

When a crystalline silicon film of the present embodiment is actually observed in detail by using TEM, it is found that most of the crystal grain boundaries (more than 90%, typically more than 95%) had grain boundaries corresponding to $\Sigma 3$, typically, {211} twin grain boundaries.

In a crystal grain boundary formed between 2 crystal grains, it is known that the grain boundary becomes a grain boundary corresponding to $\Sigma 3$ when an angle $\theta$ between lattice stripes corresponding to {111} plane is 70.5°, in case that plane orientation of both crystals are {110}. Each lattice stripe of the neighboring crystal boundaries is continued at an angle of 70.5° in the crystal grain boundary of a crystalline silicon film of the present embodiment, and accordingly it can be said that the crystal grain boundaries are grain boundaries corresponding to $\Sigma 3$.

Note that a grain boundary is grain boundary correspond to $\Sigma 9$ when $\theta=38.9°$, and other crystal grain boundaries like this also exist. In any case, there is no difference to the fact that it is inactive.

This type of crystal structure (literally, crystal grain boundary structure) shows that two different crystal grains are joined together with very good matching in the grain crystal boundaries. Namely, it is a structure in which crystal lattice is continuously joined in the crystal grain boundaries, and in which a trap level caused by crystal defects, etc are scarcely formed. Therefore it is possible to regard the semiconductor thin films having this type of crystal structure as ones in which crystal grain boundaries do not substantially exist.

Further, it has been verified by TEM observation that defects within the crystal grain almost completely disappear with a heat treatment process (corresponding to a thermal oxidation process in Embodiment 1) at a high temperature of 800 to 1150° C. It is also clear from the fact that the number of defects is greatly decreased after the heat treatment process.

The difference in the number of defects appears as the difference in spin density by electron spin resonance (ESR). At present, it is found that crystalline silicon films of the present embodiment have a spin density at least $5 \times 10^{17}$ spins/cm$^3$ or less (preferably $3 \times 10^{17}$ spins/cm$^3$ or less). However, this measurement value is near the detection limits of the present measuring equipment, and it is expected that the actual spin density is even lower.

From the above, the crystalline silicon film of the present embodiment may be regarded as a single crystal silicon film or an essentially single crystal silicon film because the number of defects in a crystal grain is notably small and the crystal grain boundaries do not substantially exist.

Embodiment 2

The structure of the pixel section that has the structure shown in Embodiment 1 is used by using FIG. 10 in the present embodiment. Note that an arbitrary one pixel in the pixel section is remarked in the top view shown in FIG. 10, and reference numerals used in Embodiment 1 is noted in the same way.

FIG. 10A is a top view showing the overlap of an active layer, a gate wiring and a source wiring, and FIG. 10B is a top view which shows a state in which a shielding and a pixel electrode is further overlapped thereon. In FIG. 10A, gate wiring 128 intersects an active layer 114 below by interposing a gate insulating film not shown in the figure. Further, though not shown in the figure, a source region, a drain region, a Loft region formed from n-type impurity region (c) are formed in the active layer 114. In addition, 1001 is a contact section of the source wiring 154 and the active layer 114, and 1002 is a contact section of the drain wiring 157 and the active layer 114.

Further in FIG. 10B, a shielding film 160 formed with an anodic oxide on its surface (which denotes an anodic oxide 161 of FIG. 4B though not shown here) and pixel electrodes 162 and 163 disposed for respective pixel are formed over the pixel TFT. A storage capacitance 164 is formed in a region in which the shielding film 160 and the pixel electrode 162 overlap by interposing the anodic oxide. Note that 1003 is a contact section of the drain wiring 157 and the pixel electrode 162.

In this embodiment, the alumina film whose dielectric constant is as high as 7 to 9 is used as a dielectric material of the capacitance storage. Thereby, the area of the capacitance storage required to form a necessary capacity can be reduced. In addition, by using the shielding film formed on the pixel TFT, as in this embodiment, as the other electrode of the capacitance storage, the aperture ratio of an image display section of an active matrix type liquid crystal display device can be improved.

Embodiment 3

In the present embodiment a case of differing the structure of the pixel section from Embodiment 2 (refer to FIG. 10) is described by using FIG. 11. Note that the structure of the pixel section described in Embodiments 1 and 2 differ only a part of the gate wiring and are the same structure as a whole. Accordingly, the same reference numerals are used regarding the same section or explain.

FIG. 11A is a cross sectional diagram of the pixel section of the present embodiment and it is characterized in that a gate wiring (note that the portions overlapping an active layer are excluded) 1101 is formed by laminating a first conductive film 1102, a second conductive film 1103 and a third conductive film 1104. Namely, a structure in which the third conductive film 1104 is sandwiched by the first conductive film 1102 and the second conductive film 1103 is adopted.

In the present embodiment tantalum nitride film is used as the first conductive film 1102, tantalum film as the second conductive film 1103, alloy film which has aluminum as its principle ingredient as the third conductive film 1104. The third conductive film 1104 is patterned into a determine shape, and the second conductive film 1103 covers thereon. Subsequently the first conductive Film 1102 and the second conductive film 1103 are etched by one shot to form the structure of the gate wiring as shown in FIG. 11A.

The top view at this point as one like shown in FIG. 11B. In other words, these portions that overlap an active layer among gate wiring (these portions may be referred to as gate electrodes) 1105a and 1105b (each corresponds to gate wirings 128a and 128b in FIG. 2E) are formed from a laminate structure of the first and the second conductive films. On the other hand, gate wiring 1101 is wider than gate wirings 1105a and 1105b in the wiring width, and formed from a triple layer structure shown in FIG. 11A. In other words, the portions among the gate wiring that are simply used as wirings are preferably formed in the structure of the present embodiment in order to lower the wiring resistance as possible.

It is preferable to devise low resistance of the wiring in an active matrix liquid crystal display device of Embodiment 1 shown in FIG. 8 by using triple layer wiring described in the present embodiment for the connecting wirings 806 and 807 that connect between terminal 805 and a scanning signal driver circuit 802 or image signal driver circuit 803.

Note that it is possible to realize the structure shown in FIG. 11B by combining Embodiment 1 and the manufacturing method for the wiring structure described in the present embodiment. Accordingly it is possible to combine the constituents of the present embodiment to an active matrix liquid crystal display device described in Embodiment 1.

Embodiment 4

In the present embodiment a pixel section that have a different structure from that of Embodiment 1 is described by using FIG. 12. Note that only the differences are described, because the basic structure is the same structure as the pisel section shown in FIG. 3C.

Firstly, the structure of FIG. 12A is an example of forming a buffer layer 1201 between the third interlayer insulating film 159 and the shielding film 160. An insulating film comprising silicon of 10 to 100 nm (preferably 30 to 50 nm) is used as the buffer layer 1201. However because degassing will be a problem in case that the third interlayer insulating film 159 is an organic resin film, it is preferable to use an insulating film that can be formed by sputtering.

In the present embodiment a silicon oxide film having 50 nm thickness is used as the buffer layer 1201. Adhesiveness between the third interlayer insulating film 159 and the shielding film 160 is increased by forming this buffer layer. In case of forming oxide 161 by anodic oxidation as shown in Embodiment 1, a trouble in which an anodic oxide is formed to wrap aroun into the interface of the third interlayer insulating film and the shielding film occurs. However, such trouble can be prevented by applying a structure of FIG. 12A.

The structure of FIG. 12B is basically similar to FIG. 12A and it is an example of forming a buffer layer 1202 in a self-aligned manner under the shielding film 160. In this case the structure of FIG. 12B can be realized by performing etching of the buffer layer in a self-aligned manner with the shielding film 160 as a mask.

Etching process may be performed either immediately after forming the shielding film 160 or after forming the oxide 161. Note however it is preferable to perform the etching process before forming the oxide 161 in case the material of the buffer layer 1202 and the material of the oxide 161 are etched by the same etching species.

Further, it is advantageous in forming contact holes in the third interlayer insulating film 159 by adopting the structure of FIG. 12B. There is a fear that a silicon oxide film remains like eaves in etching an organic resin film when a silicon oxide film etc. exists over the organic resin film. Accordingly it is preferable to remove the buffer layer in the position where contact holes are formed, like as in the structure of FIG. 12B.

The structure of FIG. 12C shows an example of forming spacers 1203a to 1203d comprising an insulating film after forming the shielding film 160 and the oxide 161, and forming the pixel electrode 1204 thereafter. An organic resin film is preferable as a material for the spacers 1203a to 1203d, and it is specifically preferable to use polyimide or acrylic which has photo-sensitivity.

By forming into the structure of FIG. 12C, short circuits between the shielding film and the pixel electrode at the edge of the shielding film 160 is prevented because the edge section of the shielding film 160 is hidden by the spacers.

Note that the constitutions of the present embodiment merely altered the formation of the third interlayer insulating film through the formation of the pixel electrode in the manufacturing processes of Embodiment 1 and other processes may be the similar processes to Embodiment 1. Accordingly, it is possible to apply them in an active matrix liquid crystal display device shown in Embodiment 1. Note that it is possible to freely combine with any constitution shown in Embodiments 1 to 3.

Embodiment 5

By fixing the potential of an electrode which is not connected with a pixel electrode (the shielding film in the present invention), a storage capacitor can be formed at each pixel of the pixel portion. In this case, the potential of the shielding film is preferably set to be in a floating state (electrically isolated state) or at common potential (the intermediate potential of picture signals sent as data).

Figure 13:
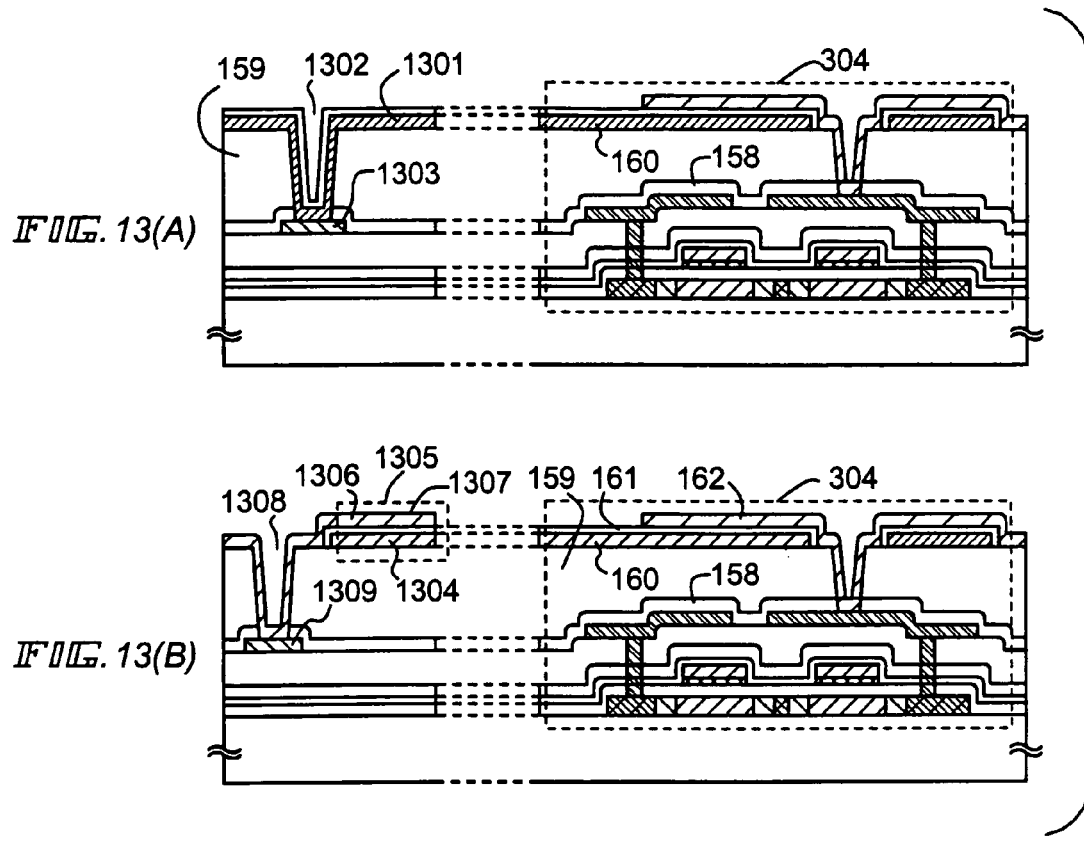
FIG. 13 is a cross-sectional diagram showing a structure of storage capacitors.

In the present embodiment, the connecting method in case the shielding film is fixed to the common potential is described with reference to FIG. 13. It is to be noted that, since its basic structure is similar to the structure of the pixel section described with reference to FIG. 4B, same reference numerals designate the same parts.

In FIG. 13A, a reference numeral 304 denotes a pixel TFT (n-channel TFT) formed in a similar way as that of Embodiment 1, and a reference numeral 160 denotes a shielding film which functions as one electrode of a storage capacitor. A shielding film 1301 extendedly existing outside the pixel section is connected with a power supply line 1303 for giving the common potential through a contact hole 1302 provided in a third interlayer insulating film 159 and a passivation film 158. The power supply line 1303 may be formed simultaneously with a source wiring or a drain wiring.

In this way, by electrically connecting the shielding film 1301 with the power supply line 1303 for giving the common potential at the outside of the pixel section, the shielding film 160 can be held at the common potential. Accordingly a process for forming contact holes by etching the third interlayer insulating film 159 and the passivation film 158 before forming the shielding film 1301 is required in this case.

Next, with reference to FIG. 13B, the reference numeral 304 denotes the pixel TFT formed in a similar way as that of Embodiment 1, and the reference numeral 160 denotes the shielding film which functions as one electrode of the storage capacitor. A shielding film 1304 extendedly existing outside the pixel section overlaps a conductive film 1306 through an oxide 1307 in a region denoted as 1305. The conductive film 1306 is formed simultaneously with a pixel electrode 162.

The conductive film 1306 is connected through a contact hole 1308 disposed in the third interlayer insulating film 159 and the passivation film 158 with a power supply line 1309 for giving the common potential. Here, in the region 1305, a capacitor comprising the shielding film 1304, the oxide 1307, and the conductive film 1306 is formed. If the capacitance of this capacitor is sufficiently large (about ten times as large as the capacitance in total of all storage capacitors connected with all pixels for one scanning line), the potential fluctuation of the shielding films 1304 and 160 can be reduced by the electrostatic coupling formed in the region 1305.

In case the structure of FIG. 13B is adopted, source line inverting driving is preferably adopted as the method of driving the active matrix liquid crystal display device. In the source line inverting driving, since the polarity of the voltage applied to a pixel electrode is reversed with regard to each one frame, charge accumulated on the shielding film 160 is almost zero when temporally averaged. That is, a state where the potential fluctuation is very small can be maintained, and thus, a stable storage capacitor can be formed.

In this way, by adopting the structure of FIG. 13B, the shielding film can be held at the common potential without increasing the number of the processes.

It is to be noted that the constituents of the present embodiment can be materialized only by modifying part of the manufacturing processes described in Embodiment 1, and the rest of the processes are similar to those in Embodiment 1. Accordingly, it is possible to apply them to the active matrix liquid crystal display device shown in Embodiment 1. Further, the constituents of the present embodiment can be freely combined with any structure described in Embodiments 1 to 3.

Embodiment 6

An example of using phosphorous for gettering of a catalytic element used for crystallizing an amorphous silicon film, but a case of using another element to getter the above stated catalytic element is explained in the present embodiment.

First, a semiconductor film having crystal structure (crystalline silicon film in the present embodiment) is obtained in accordance with the processes of embodiment 1 (up to the process of FIG. 1B). However, the introducing concentration of a catalytic element used in crystallization (a nickel is an example here) is reduced as much as possible in the present embodiment. Specifically, a 0.5 to 3 ppm by weight nickel containing layer is formed on an amorphous silicon film, and heat treatment for crystallization is performed. The nickel concentration in the crystalline silicon film thus formed is between $1\times10^{17}$ and $1\times10^{19}$ atoms/cm$^3$ (typically from $5\times10^{17}$ to $1\times10^{8}$ atoms/cm$^3$).

Heat treatment is then performed in an oxidizing atmosphere containing a halogen element after forming the crystalline silicon film and after removing the mask film. The temperature is set between 800 and 1150° C. (preferably from 900 to 1000° C.), and the processing time is set at between 10 minutes and 4 hours (preferably between 30 minutes and 1 hour).

Heat treatment is performed at 950° C. for 30 minutes in the present embodiment in an atmosphere in which oxygen atmosphere contains between 3 and 10% by volume hydrogen chloride. The nickel within the crystalline silicon film forms a volatile chloride compound (nickel chloride) by this process and is desorbed throughout the process atmosphere. In other words, it is possible to remove nickel by a halogen element gettering effect. However, if the concentration of nickel existing within the crystalline silicon film is too high, then a problem develops in which oxidation proceeds abnormally in the nickel segregated area. It is therefore necessary to reduce the concentration of nickel used at the crystallization stage to as low as possible.

The concentration of nickel remaining in the crystalline silicon film thus formed is $1\times10^{17}$ atoms/cm$^3$ or less, preferably $1\times10^{16}$ atoms/cm$^3$. Subsequently processes of FIG. 1D onward may be performed in accordance with the Embodiment 1.

Note that it is possible to apply the constituents of the present embodiment to Embodiment 1, and it is also possible to apply them to an active matrix liquid crystal display device shown in Embodiment 1. Further, it is possible to freely combine with any constituent of Embodiments 2 to 5. Moreover, it is possible to combine with the gettering process by phosphorus shown in Embodiment 1.

Embodiment 7

Figure 14:
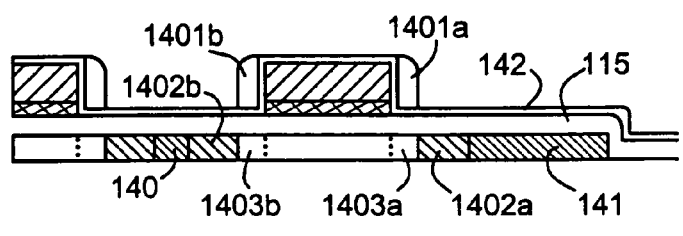
FIG. 14 is a diagram showing a LDD structure of n-channel TFTs (pixel TFTs)

An example of using a different processes from Embodiment 1 regarding manufacturing method for n-type impurity region (c) is shown in the present embodiment. FIG. 14 is used for description.

Firstly, a state of FIG. 3B is obtained in accordance with the processes of Embodiment 1. Resist masks 132 to 134 are removed next and a cap film 142 is formed. In the present embodiment the thickness of the cap film 142 is set at 20 nm.

A semiconductor film (not shown in the figure) is next formed into 0.8 to 1 μm thickness and side walls 1401*a* and 1401*b* are formed by performing anisotropic etching. N-type impurity element is then added in this state similarly to FIG. 3C and n-type impurity regions (c) 1402*a* and 1402*b* are formed. Because side walls 1401*a* and 1401*b* also function as masks, offset regions 1403*a* and 1403*b* are formed.

In the present embodiment the length (width) of offset regions 1403*a* and 1403*b* are determined by the film thickness of the side walls 1401*a* and 1401*b* and cap film 142. The present embodiment is specifically effective in case of forming the offset regions in rather long such as 100 to 200 nm.

The length of offset regions are determined by the film thickness of the cap film 142 (film thickness of the section formed on the sidewalls of the gate wiring) in the Embodiment 1 and the thickness of the cap film 142 needs to be correspondingly thick for realizing a length such as 100 to 200 run. However, because n-type impurity is added in the n-type impurity region (c) through a laminate film of the gate insulating film and the cap film, the throughput of the impurity adding process is largely decreased unless the film thickness of the gate insulating film is set extremely thin.

Accordingly when a structure of the present embodiment is adopted, the length of the offset regions 1403*a* and 1403*b* are determined by the side walls 1401*a* and 1401*b* in effect and they can be determined without any relation to the thickness of the gate insulating film. Note that though the present embodiment forms a cap film 142 for the purpose of securing selective etching in forming side walls 1401*a* and 1401*b*, it may be omitted if it is not necessary.

Note that it is possible to apply the constituents of the present embodiment to Embodiment 1, and it is also possible to apply them to an active matrix liquid crystal display device shown in Embodiment 1. Further, it is possible to freely combine with any constituent of Embodiments 2 to 5.

Embodiment 8

An example of manufacturing an active matrix substrate through processes different from Embodiment 1 is described in the present embodiment.

Impurity element imparting a conductivity type is added by through doping by interposing a gate insulating film, both in a process for forming p-type impurity region (a) and a process for forming n-type impurity region (a) in Embodiment 1. However, the formation of these impurity regions may be performed in the state of exposing the active layers by removing the gate insulating film.

In such case, when the processes up to FIG. 2E are proceeded in accordance with the Embodiment 1, a portion of active layers 111 to 114 by etching the gate insulating film in a self-aligned manner with the gate wirings 125 to 128 as masks. Note that the etching process can be performed without giving damage to the gate wirings if the resist masks (not shown in the figure) used for forming the gate wirings are remained and used as masks.

Subsequently p-type impurity region (a) and n-type impurity region (a) may be formed in this order similarly to Embodiment 1. Note however because the conditions for adding impurity elements are differed from the Embodiment 1 and there is no need to interpose a gate insulating film, the acceleration voltage is set low. The operator may select the appropriate conditions regarding doping conditions in order that the impurity concentrations included in p-type impurity region (a) and n-type impurity region (a) are realized.

Figure 15:
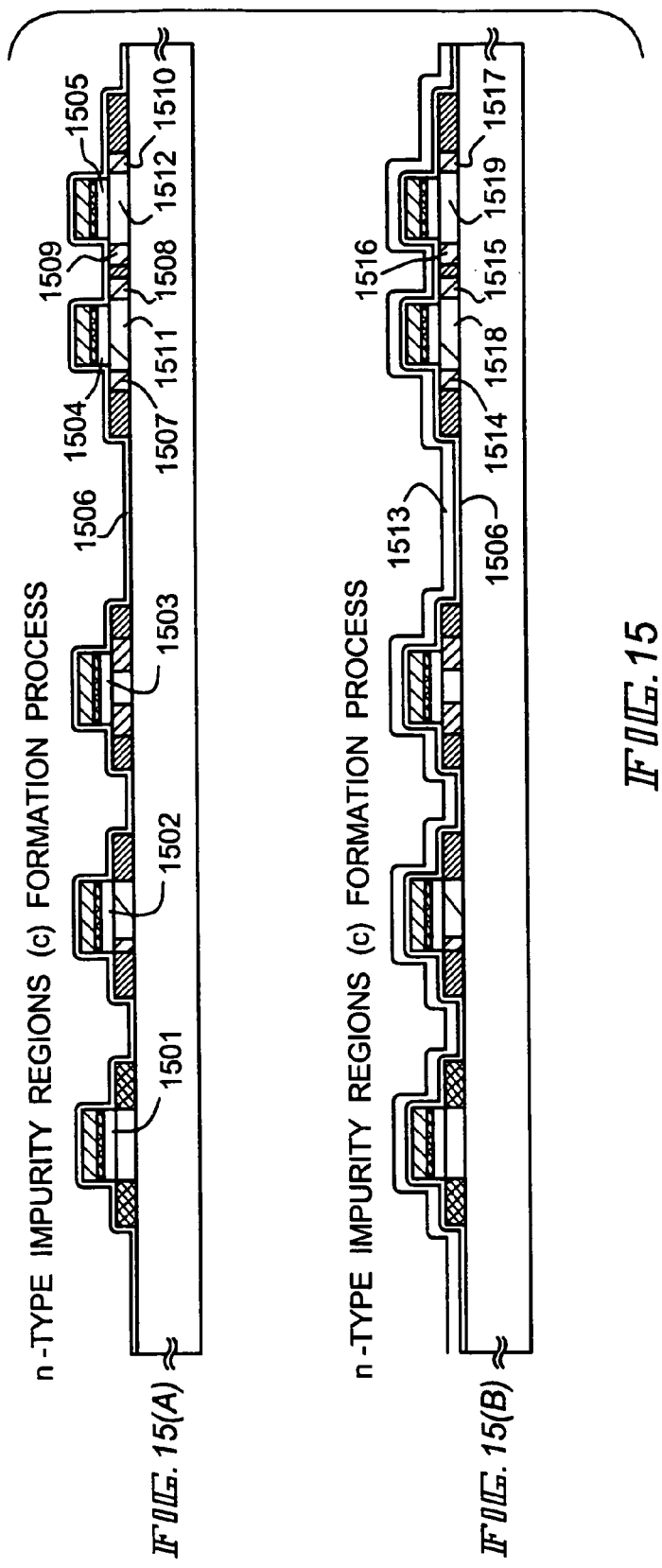
FIG. 15 is a diagram showing manufacturing processes of a pixel section and a driver circuit.

In case of adopting the manufacturing process of the present embodiment, a process corresponding to FIG. 3C of Embodiment 1 is as shown in FIG. 15A. In FIG. 15A, 1501 to 1505 are gate insulating films formed in a self-aligned manner with gate wirings as masks, and a cap film 1506 is formed to cover the gate wirings. N-type impurity element is then added in this state in a similar way to FIG. 3C, and n-type impurity regions (c) 1507 to 1510 are formed. Here, offset regions (not shown in the figure) having a length approximately corresponding to the film thickness of the cap film 1506 are formed between the channe forming region 1511 and 1512, and n-type impurity regions (c) 1507 to 1510.

Depending on cases, a second cap film 1513 may be formed over the cap film 1506 and n-type impurity element may be added through the laminate film. Between thus formed n-type impurity regions (c) 1514 to 1517 and channel forming regions 1518 and 1519, offset regions (not shown in the figure) having length approximately correspond to the total film thickness of the cap film 1506 and the second cap film 1513 are formed.

In the structure of FIG. 15B the length of the offset regions can be freely adjusted by adjusting the thickness of the second cap film 1513. An insulating film comprising silicon (preferably silicon oxynitride film) is used for the second cap film 1513 and the film thickness may be set at 30 to 200 nm (preferably 50 to 150 nm).

Though the preent embodiment uses a silicon nitride film as a cap film (the first cap film) 1506, silicon nitride film may cause a problem such as peeling because the stress is strong when it is formed thickly. Accordingly though a film thickness to a certain extent is desirably formed as an anti-oxidation film of the gate wiring, when the film thickness is thin there are cases in which effective offset regions cannot be formed. In such cases, the structure shown in FIG. 15B is effective.

Note that the constituents of the present embodiment can be realized by modifying the Embodiment 1 and it can be applied to the active matrix liquid crystal display device shown in Embodiment 1. Further, it is possible to freely combine with any constitution of Embodiments 2 to 7.

Embodiment 9

An example of manufacturing an active matrix substrate through processes different from Embodiment 1 is described in the present embodiment by using FIG. 16.

Firstly processes through FIG. 2E are performed in accordance with the processes of Embodiment 1. Next a cap film 1601 comprising the same material as the gate insulating film (silicon oxynitride film in the present embodiment) is formed into 30 nm thickness. N-type impurity regions (c) 1602 and 1603 are then formed by performing a process for adding n-type impurity element in the same conditions as FIG. 3C. (FIG. 16A)

Gate insulating film is next etched in a self-aligned manner with the gate wirings as masks, and gate insulating films 1605 to 1609 just under the gate wirings are formed. Resist mask 1610 is nest formed and p-type impurity region (a) 1611 and 1612 are formed by performing a process for adding p-type impurity element in the same conditions as FIG. 3A. (FIG. 16B)

Resist mask 1610 is next removed and new resist masks 1613 to 1616 are formed. N-type impurity regions (a) 1617 to 1623 are then formed by performing a process for adding n-type impurity element similarly to FIG. 3C. (FIG. 16C)

Resist masks 1613 to 1616 are next removed and a first interlayer insulating film 1624 is formed. Though the present embodiment uses a laminate film of a silicon nitride film of 50 nm thickness and a silicon oxynitride film of 200 nm thickness, the structure is not limited to multi layer, and it is possible to use a single layer structure formed from an insulating film comprising silicon.

Activation process of the added impurity elements is next performed after forming the first interlayer insulating film 1624. In the present embodiment activation is performed by furnace annealing at 800° C. for 1 hour. (FIG. 16D)

An active matrix substrate is manufactured by following the above stated manufacturing processes, and an active matrix liquid crystal display device can be manufactured by performing a known cell assembly process. Note that the different points in the structure from the active matrix substrate shown in Embodiment 1 (FIG. 4B) is merely the composition of the gate insulating film and the first interlayer insulating film, and the function of the driver circuit and the pixel circuit not different from Embodiment 1 can be obtained.

Note that the constituents of the present embodiment can be realized by modifying the corresponding sections of Embodiment 1 and an active matrix liquid crystal display device of the similar to that of the active matrix liquid crystal display device shown in Embodiment 1 can be manufactured. Further, it is possible to freely combine with any constitution of Embodiments 2 to 8.

Embodiment 10

The manufacturing processes shown in Embodiment 1 shows an example of controlling the threshold voltage by performing channel doping process into the regions that will become n channel TFTS, however it is possible to perform channel doping process on the entire surface without discriminating n-channel TFTs and p-channel TFTs. In that case because the number of photo masks in the manufacturing processes are reduced, the increase of throughput and yield can be devised.

Further in some cases a case of performing the channel doping process on the entire surface and then adding impurity element imparting the reverse conductivity type from that added on the entire surface in either of n-channel TFTs or p-channel TFTs, is feasible.

Note that the constituents of the present embodiment can be freely combined with any constituent shown in Embodiments 2 to 9.

Embodiment 11

In the example of the manufacutring processes shown in Embodiment 1, formation of n-type impurity region (b) that later functions as a Lov region is performed prior to forming the gate wiring of the n-channel TFTs is premised. A characteristic is that p-type impurity region (a) and n-type impurity region (c) are both formed in a self-aligned manner.

However, in order to obtain the effects of the present invention it is sufficient if the final structure is a structure shown in FIG. 4B, and there is no limitation to the processes for achieving the structure. Accordingly the order of impurity region formation may be appropriately altered by the operator. Further, depending on cases it is possible to form p-type impurity region (a) and n-type impurity region (c) by using resist masks. In other words, any combination of process order may be adopted if TFTs having different active layer structure are finally formed in accordance with the respective circuit as shown in FIG. 4B.

Embodiment 12

A case of applying the present invention to a semiconductor device manufactured over a silicon substrate is described in the present embodiment. Typically it can be applied to a reflection type liquid crystal display device using a metallic film having high reflectance as the pixel electrode.

In this embodiment, an n-type or a p-type impurity element is directly added to the silicon substrate (silicon wafer) to form impurity regions such as LDD region, source region or drain region in Embodiment 1. In doing so, the formation order of each impurity region and gate insulating film does not matter.

Note that the constituents of this Embodiment can be freely combined with any constituent of Embodiments 1 to 11. However because the semiconductor that becomes the active layer is already determined to the single crystal silicon substrate, it is a combination in the sections except for crystallizing process.

Embodiment 13

In case of Embodiment 1, the description has been made on the premise that Lov regions and Loff regions are disposed only in the n-channel type TFTs, and the positions thereof are used properly in accordance with the circuit specifications, but, if the TFT size is reduced (channel length is shortened), then the same thing comes to apply also to the p-channel type TFT.

Namely, if the channel length becomes 2 μm or below, then the short channel effect comes to be actually revealed, so that, in some cases, it becomes necessary to dispose a Lov region also in the p-channel type TFT. As stated above, in the invention, the p-channel type TFT is not limited to the structure shown in Embodiment 1, 4 to 31, but may be of the same structure as that of the n-channel type TFT.

Further, in case of practicing this Embodiment, impurity regions are to be formed which contain a p-type impurity element at a concentration of $2 \times 10^{16}$ to $5 \times 10^{19}$ atoms/cm$^3$, as in case the n-type impurity regions (b) are formed in the constitution according to Embodiment 1. Further, it is possible to freely combine the constituents of the present embodiments with any constituent of Embodiment 2 to 13.

Embodiment 14

The present invention can also be used in case an interlayer dielectric film is formed on a known MOSTFT, and, on this interlayer dielectric film, a TFT is formed. That is, it is possible to realize a semiconductor device having a three-dimensional structure. Further, as the substrate, there can be used a SOI substrate such as SIMOX, Smart-Cut (registered trademark of SOITEC Inc.) or ELTRAN (registered trademark of Canon Inc.).

The constituents of this Embodiment can be freely combined with the constitution of any of Embodiment 1 to 12.

Embodiment 15

The liquid crystal display device fabricated according to the invention can use various liquid crystal materials. As such materials, there can be enumerated TN liquid crystal, PDLC (polymer dispersed liquid crystal), FLC (ferroelectric liquid crystal), AFLC (antiferroelectric liquid crystal), and a mixture of FLC and AFLC.

For example, there can be used the material disclosed in: H. Furue et al., Charakteristics and Driving Scheme of Polymer-Stabilized Monostable FLCD Exhibiting Fast Response Time and High Contrast Ratio with Gray-Scale Capability, SID, 1998; T. Yoshida et al., A Full-Color Thresholdless Antiferroelectric LCD Exhibiting Wide Viewing Angle with Fast Response Time, 841, SID97DIGEST, 1997; S. Inui et al., "Thresholdless antiferroelectricity in liquid crystals and its application to displays, 671–673, J. Mater. Chem. 6(4), 1996; or U.S. Pat. No. 5,594,569.

Specifically there is some that show V-shaped (or U-shaped) electro-optical characteristics among the thresholdless antiferroelectric LCD (abbreviated to TL-AFLC) that show electro-optical response characteristic in which transmittivit y is continuously varied with respect to the electric field, and even the liquid crystals whose driver voltage are about ±2.5 V (cell thickness approximately 1 μm to 1 μm) are found. Accordingly there are cases in which a power supply voltage of about 5 to 8 V is sufficient, and the possibility of driving the driver circuit and the pixel section at a same power supply voltage is suggested. Namely the low consumption electric power of the whole liquid crystal display device can be devised.

Further, a ferroelectric liquid crystal or an anti-ferroelectric liquid crystal has the merit that its response speed is fast as compared with a TN liquid crystal. A crystalline TFT as used in the present invention can realize a TFT with a very fast operating speed, so that it becomes possible to realize a liquid crystal display device with a fast image response speed in which the fastness in response speed of a ferroelectric liquid crystal or an antiferroelectric liquid crystal is sufficiently utilized.

Further, thresholdless anti-ferroeoectric liquid crystals have large spontaneous polarity, and dielectric constant of the liquid crystal itself is high in general. Accordingly a comparatively large storage capacitor is required in the pixels in case of using the thresholdless anti-ferroelectric mixed liquid crystals in a liquid crystal display device. Therefore it is preferable to use a thresholdless anti-ferroelectric mixed liquid crystals having small spontaneous polarity. In that sense a storage capacitor shown in FIG. 3C of Embodiment 1 is preferable because a large capacitance can be stored in a small area.

It is a matter of course that the liquid crystal display device according to this Embodiment can be effectively used as the display of an electronic device such as a personal computer.

Note that the constituents of the present embodiment can be freely combined with any constituent of Embodiments 1 to 14.

Embodiment 16

Figure 17:
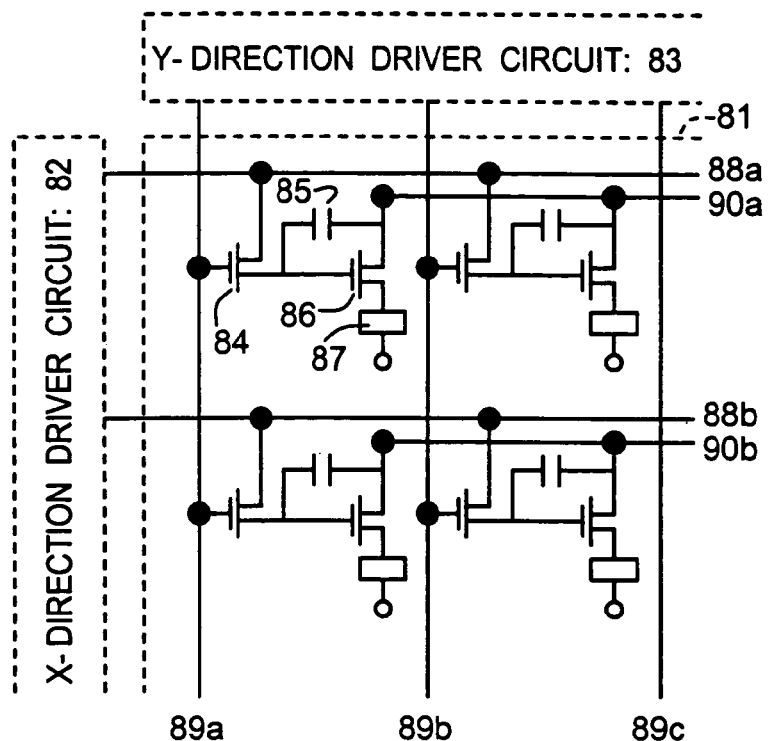
FIG. 17 is a diagram showing a structure of an active matrix EL display device.

The present invention can also be applied to an active matrix EL (Electroluminescence) display (which is also known as active matrix EL display device). FIG. 17 shows an example thereof.

FIG. 17 shows a circuit diagram of the active matrix EL display according to this Embodiment. The reference numeral 81 denotes a display region, and, in the periphery thereof, an X-direction (source side) driving circuit 82 and a Y-direction (gate side) driving circuit 83 are provided. Further, the pixels in the display region 81 each include a switching TFT 84, a capacitor 85, a current controlling TFT 86, and an EL element 87, wherein, to the switching TFT 84, there are connected an X-direction signal line (source signal line) 88a (or 88b) and a Y-direction signal line (gate signal line) 89a (or 89b, 89c). Further, to the current controlling TFT 86, power supply lines 90a and 90b are connected.

In an active matrix EL display of the present embodiment X-direction control circuit 82 and Y-direction control circuit 83 are formed by combining p-channel TFT 301 of FIG. 4B and n-channel TFT 302 or 303. Further, an n-channel TFT 304 of FIG. 4B is used for the switching TFT 84 and a p-channel TFT 301 of FIG. 4B is used for the current control TFT 86. Needless to say, the combination of the TFTs is not necessarily limited to these.

Any constituent of Embodiments 1 to 13 may be combined to an active matrixl EL display of the present embodiment.

Embodiment 17

Figure 18:
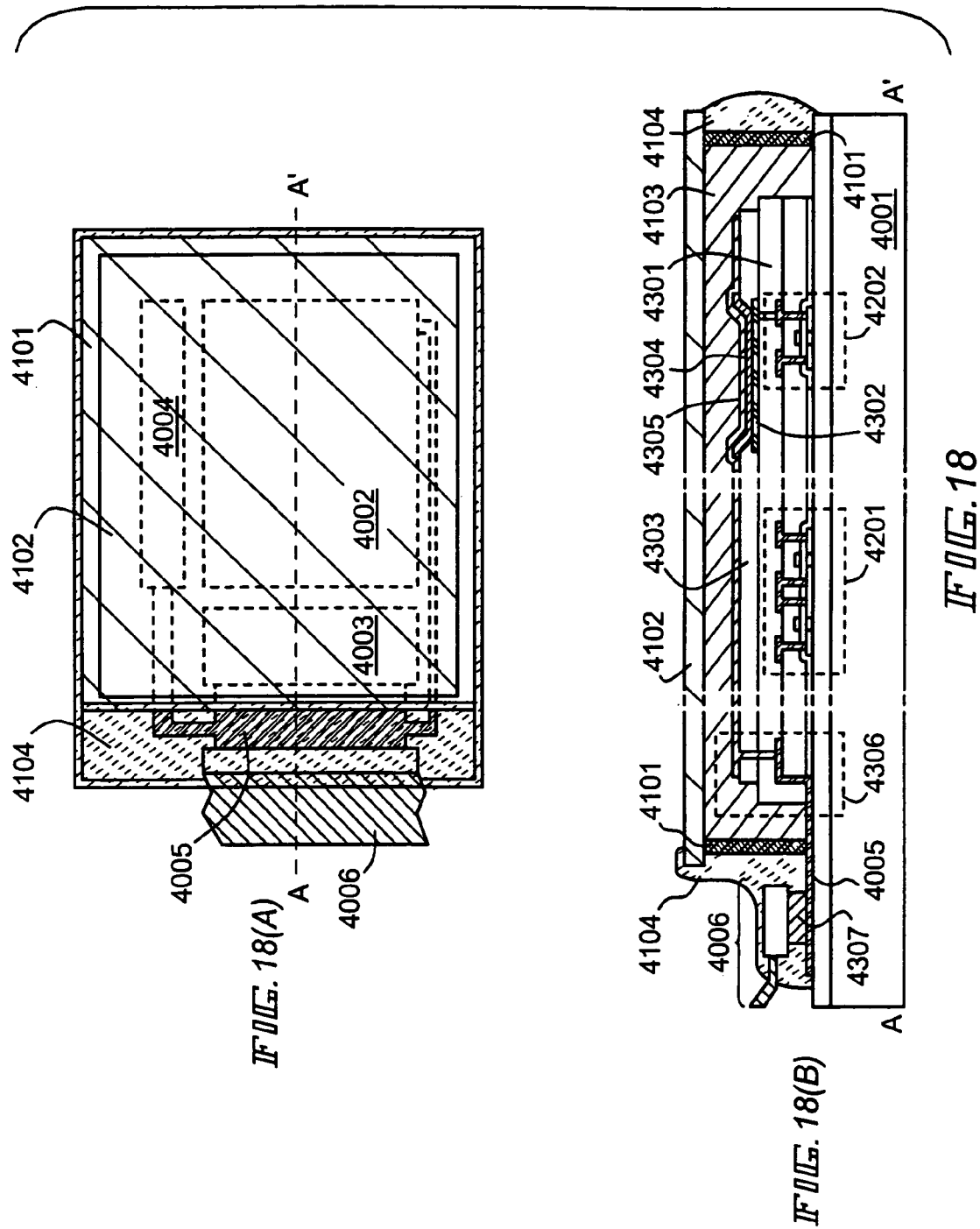
FIG. 18 is a diagram showing a top view and a cross-sectional structure of an EL display device.

This Embodiment will be described with reference to an example of the case where an EL (electroluminescence) display device is fabricated by the use of the present invention. FIG. 18A is a top view of the EL display device according to the invention, and FIG. 18B is a sectional view thereof.

Referring to FIG. 18A, numeral 4001 denotes a substrate, numeral 4002 denotes a pixel section, numeral 4003 denotes a source-side driving circuit, and numeral 4004 denotes a gate-side driving circuit, wherein the respective driving circuits lead to an FPC (flexible printed circuit) 4006 via a wiring 4005 and is connected to an external apparatus.

In this case, a first sealing material 4101, a cover member 4102, a filling material 4103 and a second sealing material 4104 are provided to surround the pixel section 4002, the source-side driving circuit 4003 and the gate-side driving circuit 4004.

Further, FIG. 18B corresponds to a sectional view taken along the line A–A' in FIG. 18A, wherein, on the substrate 4001, there are formed a driving TFT (note that an n-channel type TFT and a p-channel type TFT are shown here) 4201 included in the source side driving circuit 4003 and a current controlling TFT (a TFT for controlling the current to the EL element) 4202 included in the pixel portion 4002.

In this Embodiment, as the driving TFT 4201, there are used TFTs of the same structure as that of the p-channel TFT 301 and the n-channel TFT 302 shown in FIG. 4B, and, as the current controlling TFTs 4202, there is used a TFT of the same structure as that of the p-channel TFT 301 shown in FIG. 4B. Further, in the pixel portion 4002, there is provided a storage capacitance (not shown) connected to the gate of the current controlling TFT 4202.

Over the driving TFT 4201 and the pixel TFT 4202, there is formed an interlayer dielectric film (planarization film) 4301 composed of a resin material, and, formed on this interlayer dielectric film 4301 is a pixel electrode (anode) 4302 which is electrically connected to the drain of the pixel TFT 4202. As the pixel electrode 4302, a transparent conductive film which has a large work function is used. As the transparent conductive film, a compound of indium oxide and tin oxide or a compound of indium oxide and zinc oxide can be used.

Further, on the pixel electrode 4302, there is formed an insulation film 4303, which has an opening formed on the pixel electrode 4302. In this opening, an EL (electroluminescence) layer 4304 is formed on the pixel electrode 4302. As the material of the EL layer 4304, a known organic EL material or inorganic EL material can be used. Further, as organic EL materials, there are a low molecular (monomer) material and a high molecular (polymer) material, but either one can be used.

As the method of forming the EL layer 4304, the known evaporation technique or application technique may be used. Further, as for the structure of the EL layer, a hole injection layer, a hole transport layer, a light emitting layer, an electron transport layer or an electron injection layer may be freely combined into a laminate structure or a single-layer structure.

Formed on the EL layer 4304 is a cathode 4305 comprising a conductive film having light shielding properties (typically, a conductive film composed mainly of aluminum, copper or silver or a laminate film comprising such film and another conductive film). Further, the moisture and oxygen existing in the interface between the cathode 4305 and the EL layer 4304 should desirably be removed as much as possible. Accordingly, it is necessary to take a suitable measure such as the measure of continuously forming the EL layer 4304 and the cathode 4305 in vacuum or the measure of forming the EL layer 4304 in a nitrogen or rare gas atmosphere and forming the cathode 4305 without in contact with moisture or oxygen. In this Embodiment, the above-mentioned film deposition is made possible by the use of a multi-chamber system (cluster tool system) deposition apparatus.

The cathode 4305 is then electrically connected to the wiring 4005, in a region indicated by numeral 4306. The wiring 4005 is a wiring for applying a predetermined voltage to the cathode 4305 and electrically connected to the FPC 4006 through an anisotropic conductive film 4307.

In this way, an EL element comprised of the pixel electrode (anode) 4302, the EL layer 4304 and the cathode 4305 is formed. EL elements are surrounded by the first sealing material 4101 and the cover member 4102 bonded to the substrate 4001 by the first sealing material 4101 and is enclosed by a filling material 4103.

As the cover member 4102, a glass plate, a metal plate (generally a stainless steel plate), a ceramics plate, an FRP (fiberglass-reinforced plastics) plate, a PVF (polyvinyl fluoride) film, a Mylar film, a polyester film or an acrylic film can be used. Further, there can also be used a sheet constituted in such a manner that an aluminum foil is sandwiched between PVF films or Mylar films.

However, in case the direction of the light radiated from the EL element faces the cover member side, the cover member must be made transparent. In this case, a transparent substance film such as a glass plate, a plastics plate, a polyester film or an acrylic film is used.

Further, as the filling material 4103, an ultraviolet-curing resin or a thermosetting resin can be used; PVC (polyvinyl chloride), acrylic, polyimide, epoxy resin, silicone resin, PVB (polyvinyl butyral) or EVA (ethylene vinyl acetate) can be used. In case a moisture absorbing substance (preferably barium oxide) is provided within this filling material 4103, the deterioration of the EL element can be suppressed.

Further, spacers may be incorporated within the filling material 4103. In this case, if the spacer is formed from barium oxide, then it is possible to provide the spacer itself with moisture absorbing properties. Further, in case the spacer is provided, it is effective to provide a resin film on the cathode 4305 as a buffer layer for alleviating the pressure from the spacer.

Further, the wiring 4005 is electrically connected to the FPC 4006 through the anisotropic conductive film 4307. The wiring 4005 conducts to the FPC 4006 the signals sent to the pixel portion 4002, the source side driving circuit 4003 and the gate side driving circuit 4004 and is electrically connected to an external apparatus by the FPC 4006.

Further, in this Embodiment, the second sealing material 4104 is provided so as to cover the exposed portion of the first sealing material 4101 and a portion of the FPC 4006, whereby the EL element is thoroughly shut off from the outside air. Thus an EL display device having the sectional structure shown in FIG. 18B is formed. The EL display device according to this Embodiment may be fabricated in combination with the constitution according to any of Embodiments 1, 3, 6 to 11, 13 and 14.

Figure 19:
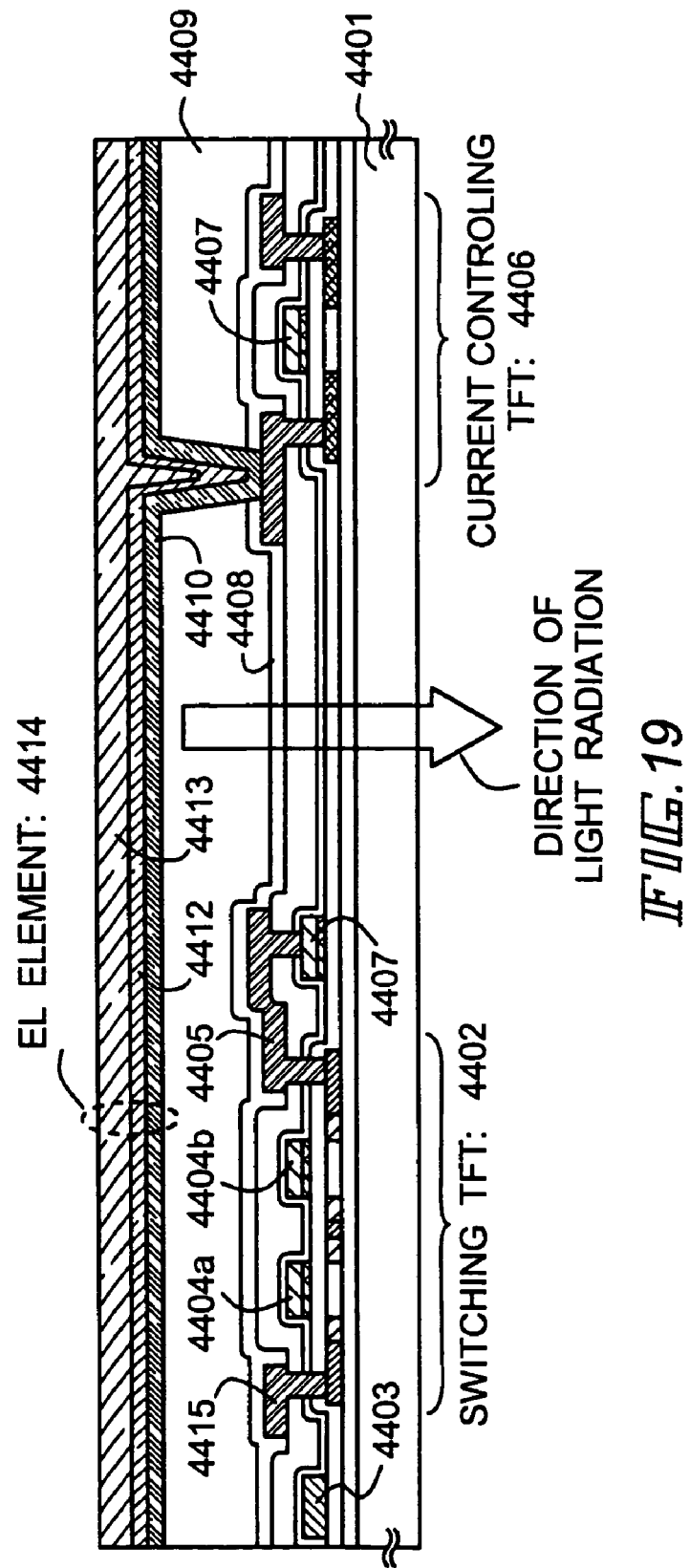
FIG. 19 is a diagram showing a cross-sectional structure of an EL display device.
Figure 20:
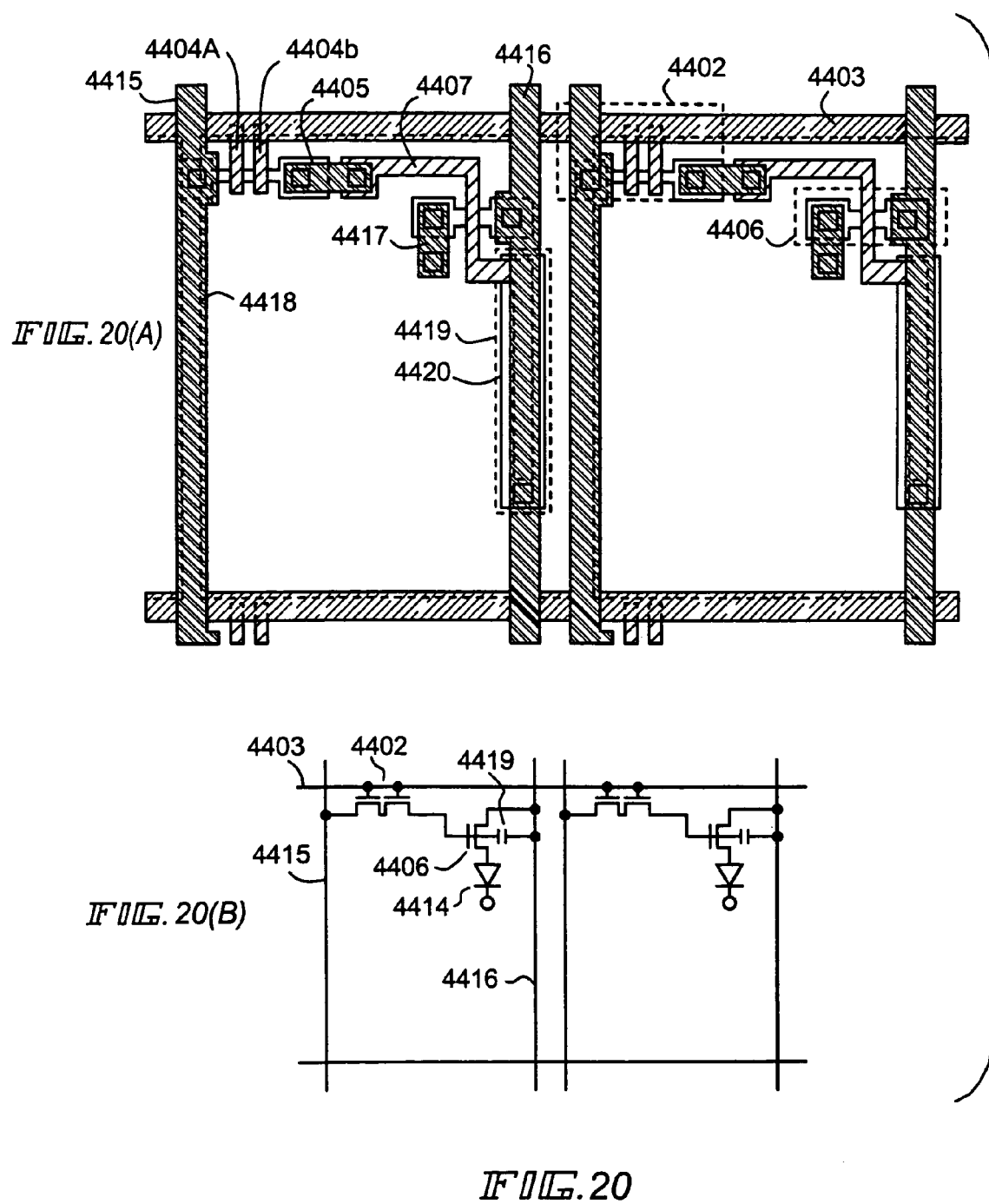
FIG. 20 is a diagram showing a top view and a cross-sectional structure of an EL display device.

Here, FIG. 19 shows a further detailed sectional structure of the pixel portion, FIG. 20A shows the top view thereof, and FIG. 20B shows a circuit diagram thereof. In FIG. 19, FIG. 20A and FIG. 20B, common reference numerals are used, so that they may be referred to by one another.

Referring to FIG. 19, a switching TFT 4402 provided on a substrate 4401 is formed by the use of the n-channel type TFT 304 shown in FIG. 4B. Therefore, as the description of the structure, the description of the n-channel type TFT 304 can be referred to. Further, the wiring indicated by numeral 4403 is a gate wiring which electrically connects the gate electrodes 4404a and 4404b of the switching TFT 4402.

In this Embodiment, the double gate structure in which two channel forming regions are formed is employed, but it may be the single gate structure in which one channel forming region is formed or the triple gate structure in which three channel forming regions are formed.

Further, a drain wiring 4405 of the switching TFT 4402 is electrically connected to a gate electrode 4407 of a current controlling TFT 4406. The current controlling TFT 4406 is formed by the use of the p-channel type TFT 301 shown in FIG. 4B. Therefore, as the description of the structure, the description of the p-channel type TFT 301 can be referred to. In this Embodiment, the single gate structure is employed, but the double gate structure or the triple gate structure may be employed.

Over the switching TFT 4402 and the current controlling TFT 4406, there is provided a first passivation film 4408, on which a planarization film 4409 comprising a resin is formed. It is very important to planarize, by the use of the planarization film 4409, the steps due to the TFTs. Since the EL layer which will be formed later is very thin, so that, due to the existence of such steps, defective light emission is caused in some cases. Therefore, it is desirable to perform planarization, before the formation of the pixel electrode, so that the EL layer can be formed as flat as possible.

Further, numeral 4410 denotes a pixel electrode (the anode of the EL element) comprising a transparent conductive film, and this pixel electrode 4410 is electrically connected to a drain wiring 4411 of the current controlling TFT 4406. As the pixel electrode 4410, there can be used a conductive film composed of a compound of indium oxide and tin oxide or a compound of indium oxide and zinc oxide.

On the pixel electrode 4410, an EL layer 4412 is formed. In case of FIG. 19, only one pixel is shown, but, in this Embodiment, EL layers corresponding to the respective colors, R (red), G (green) and B (blue), are made distinctly. Further, in this Embodiment, the EL layer 4412 is formed of a low-molecular organic EL material by the evaporation method. More specifically, there is employed the stacked layer structure constituted in such a manner that, as a hole injection layer, a copper phthalocyanine (CuPc) film is provided to a thickness of 20 nm, and, on this film, a tris-8-quinolinolato aluminum complex ($Alq_3$) film is provided. By adding fluorescent dyes such as quinacridon, Perylene or DCM1 to the $Alq_3$, the color of emitted light can be controlled.

However, the stated above is an example of the organic EL materials which can be used for the EL layer, and therefore, this Embodiment need not be limited to the above-mentioned example at all. The EL layer (a layer for effecting light emission and the transport of the carriers therefor) may be formed by freely combining the light emitting layer, the charge transport layer or the charge injection layer. For example, in this Embodiment, an example of the case where a small-molecular organic EL material is used as the material of the EL layer is set forth, but a polymer organic EL material may be used instead. Further, as the material of the charge transport layer or the charge injection layer, an inorganic material such as silicon carbide can also be used. As these organic and inorganic EL materials, known materials can be used.

Next, on the EL layer 4412, a cathode 4413 comprising a light-shielding conductive film is provided. In case of this Embodiment, an alloy film consisting of aluminum and lithium is used as the light-shielding conductive film. Of course, a known MgAg film (an alloy film consisting of magnesium and silver) may be used instead. As the cathode material, there is used a conductive film comprising an element belonging to the group I or II of the periodic table or a conductive film to which these elements are added.

At the point of time when this cathode 4413 is formed, the EL element 4414 is completed. By the EL element 4414 mentioned here, the capacitor formed of the pixel electrode (anode) 4410, the El layer 4412 and the cathode 4413 is referred to.

Next, the top view of the pixel according to this Embodiment will be described by referring to FIG. 20A. The source of the switching TFT 4402 is connected to a source wiring 4415, and the drain thereof is connected to the drain wiring 4405. Further, the drain wiring 4405 is electrically connected to the gate electrode 4407 of the current controlling TFT 4406. The source of the current controlling TFT 4406 is electrically connected to a current supply line 4416, and the drain thereof is electrically connected to a drain wiring 4417. The drain wiring 4417 is electrically connected to a pixel electrode (anode) 4418 indicated by a dotted line.

In this case, in the region indicated by numeral 4419, a capacitance storage is formed. The capacitance storage 4419 is formed among a semiconductor film 4420 electrically connected to the current supply line 4416, an insulation film (not shown) which is the same layer constituting the gate insulating film, and the gate electrode 4407. Further, the capacitance constituted by the gate electrode 4407, the same layer (not shown) as the first interlayer dielectric film, and the current supply wiring 4416 can be also used as a capacitance storage.

In case the EL display device according to this Embodiment is fabricated, it can be practiced in free combination with the constitutions according to Embodiments 1, 3, 6 to 11, 13 and 14.

Embodiment 18

Figure 21:
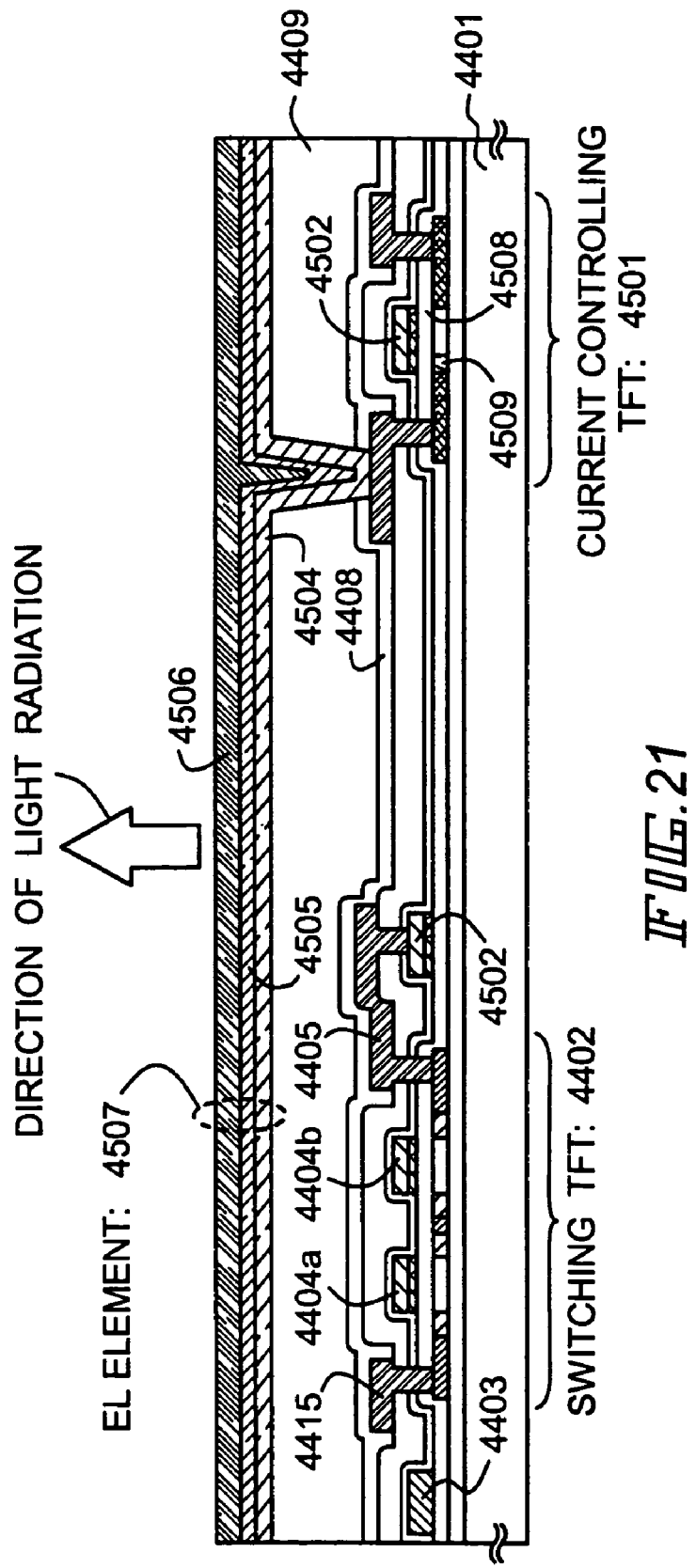
FIG. 21 is a diagram showing a cross-sectional structure of an EL display device.

This Embodiment will be described with reference to an EL display device which has a pixel structure different from that of Embodiment 17. For the description of this Embodiment, FIG. 21 is used. Concerning the portions to which the same reference numerals are used as those used in FIG. 19, the description of Embodiment 17 can be referred to.

In case of the structure shown in FIG. 21, a TFT having the same structure as the n-channel type TFT 302 shown in FIG. 4B is used as a current controlling TFT 4501. Of course, a gate electrode 4502 of the current controlling TFT 4501 is connected to the drain wiring 4405 of the switching TFT 4402. Further, the drain wiring 4503 of the current controlling TFT 4501 is electrically connected to a pixel electrode 4504.

In this Embodiment, the pixel electrode 4504 functions as the cathode of the EL element and is formed by the use of a light-shielding conductive film. More specifically, an alloy film consisting of aluminum and lithium is used, but a conductive film composed of elements belonging to the group I or II of the periodic table or a conductive film to which these elements are added may be used.

On the pixel electrode 4504, an EL layer 4505 is formed. In FIG. 21, only one pixel is shown, but, according to this Embodiment, an EL layer corresponding to G (green) is formed by the evaporation method and the application method (preferably, the spin coating method). More specifically, there is formed a laminate structure constituted in such a manner that a lithium fluoride (LiF) film with a thickness of 20 nm is provided as an electron injection layer, on which a PPV (polyparalphenylene vinylene) film with a thickness of 70 nm is provided as a light emitting layer.

Next, on the EL layer 4505, an anode 4506 comprising a transparent conductive film is provided. In case of this Embodiment, as the transparent conductive film, there is used a conductive film comprising a compound of indium oxide and tin oxide or a compound of indium oxide and zinc oxide.

At the point when this anode 4506 is formed, an EL element 4507 is competed. By the EL element 4507 mentioned here, the capacitor formed of the pixel electrode (cathode) 4504, the EL layer 4505 and the anode 4506 is referred to.

In this case, the fact that the current controlling TFT 4501 is of the structure according to the present invention has a very important meaning. The current controlling TFT 4501 is an element for controlling the quantity of current flowing through the EL element 4507, so that much current flows through the current controlling TFT 4501; and therefore, the current controlling TFT 4501 is also an element which is exposed to the high danger of its being deteriorated due to heat or hot carriers. Therefore, the structure according to the present invention in which, at the drain side of the current controlling TFT 4501, a LDD region 4509 is provided so as to overlap the gate electrode 4502 through a gate insulating film 4508, is very effective.

Further, the current controlling TFT 4501 according to this Embodiment is constituted in such a manner that a parasitic capacitance called gate capacitance is formed between the gate electrode 4502 and the LDD region 4509. By adjusting this gate capacitance, a function equal to the capacitance storage 4418 shown in FIGS. 20A and 20B can be provided. Particularly, in case the EL display device is operated in accordance with the digital driving method, the capacitance of the capacitance storage can be smaller than in case the EL display device is operated in accordance with the analog driving method, so that the capacitance storage can be substituted by the gate capacitance.

In case of fabricating the EL display device according to this Embodiment, it can be practiced in free combination with the constitution according to Embodiments 1, 3, 6 to 11, 13 and 14.

Embodiment 19

This embodiment shows examples of the pixel structure which can be applied to the pixel section of the EL display device according to Embodiment 17 or 18 in FIGS. 22A to 22C. In this Embodiment, numeral 4601 denotes the source wiring of a switching TFT 4602, numeral 4603 denotes the gate wiring of the switching TFT 4602, numeral 4604 denotes a current controlling TFT, numeral 4605 denotes a capacitor, numerals 4606 and 4608 denote current supply lines, and numeral 4607 denotes an EL element.

FIG. 22A shows an example of the case where the current supply line 4606 is commonly used between two pixels. That is, the feature of this example lies in the point that the two pixels are formed so as to become line-symmetrical with reference to the current supply line 4606. In this case, the number of power supply lines can be reduced, so that the pixel portion can be made more precise.

Further, FIG. 22B shows an example of the case where the current supply line 4608 is provided in parallel to the gate wiring 4603. In the structure shown in FIG. 22B, the current supply line 4608 and the gate wiring 4604 are provided so as not to overlap each other, but if they are wirings formed on different layers, they can be provided so as to overlap each other through an insulation film. In this case, the occupied area can be used jointly by the power supply line 4608 and the gate wiring 4603, so that the pixel portion can be made further precise.

The feature of the structure shown in FIG. 22C lies in the point that, as in case of the structure shown in FIG. 22B, the current supply line 4608 is provided in parallel to gate wirings 4603, and further, two pixels are formed so as to become line-symmetrical with reference to the current supply line 4608. Further, it is also effective to provide the current supply line 4608 so as to overlap one of the gate wirings 4603. In this case, the number of the power supply lines can be reduced, so that the pixel portion can be made further precise.

Embodiment 20

Figure 23:
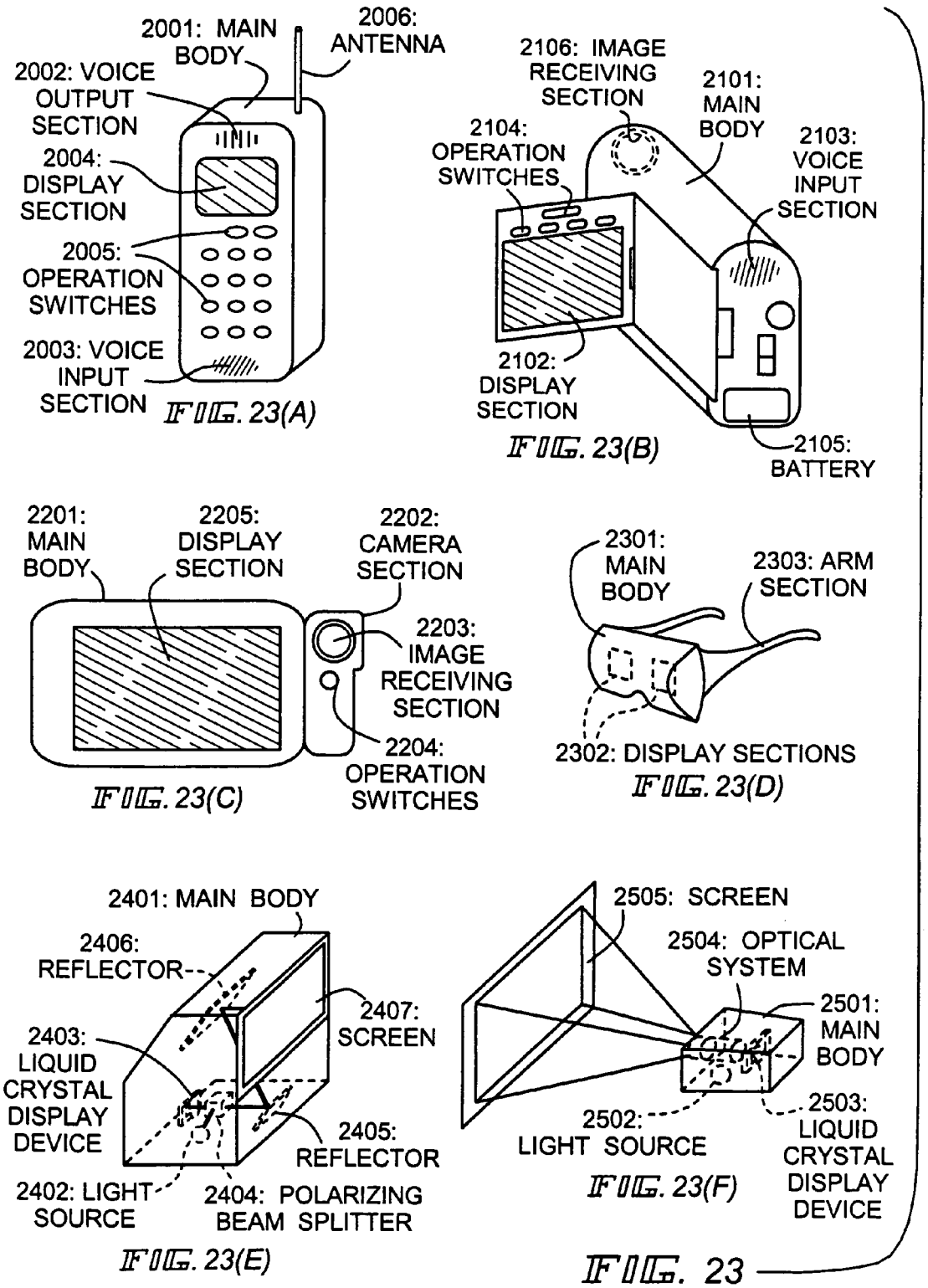
FIG. 23 is a diagram showing examples of electric appliances.

The electro-optical device and the semiconductor circuit according to the present invention can be used as the display section and the signal processing circuit of an electric appliance. As such electric appliances, there can be enumerated a video camera, a digital camera, a projector, a projection TV, a goggle type display (head mount display), a navigation system, a sound reproducing apparatus, a notebook type personal computer, a game machine, a portable information terminal equipment (a mobile computer, a portable telephone, a portable game machine or an electronic book) and an image reproducing apparatus with a recording medium. FIG. 23 to FIG. 25 show concrete examples of these electric appliances.

FIG. 23A is a portable telephone, which is comprised of a main body 2001, a voice output portion 2002, a voice input portion 2003, a display section 2004, operation switches 2005 and an antenna 2006. The electro-optical device according to the present invention can be used in the display section 2004, while the semiconductor circuit according to the invention can be used in the voice output portion 2002, the voice input portion 2003, the CPU or the memory, etc.

FIG. 23B is a video camera, which is comprised of a main body 2101, a display section 2102, a voice input portion 2103, operation switches 2104, a battery 2105, and an image receiving section 2106. The electro-optical device according to the present invention can be used in the display section 2102, while the semiconductor circuit according to the invention can be used in the voice input section 2103, the CPU or the memory, etc.

FIG. 23C is a mobile computer, which is comprised of a main body 2201, a camera section 2202, an image receiving section 2203, operation switches 2204 and a display section 2205. The electro-optical device according to the invention can be used in the display section 2205, while the semiconductor device according to the invention can be used in the CPU or the memory, etc.

FIG. 23D is a goggle type display, which is comprised of a main body 2301, display sections 2302, and arm sections 2303. The electro-optical device according to the invention can be used in the display sections 2302, while the semiconductor circuit according to the invention can be used in the CPU or the memory, etc.

FIG. 23E shows a rear projector (projection TV), which is comprised of a main body 2401, a light source 2402, a liquid crystal display device 2403, a polarization beam splitter 2404, reflectors 2405 and 2406, and a screen 2407. The invention can be used in the liquid crystal display device 2403, while the semiconductor circuit according to the invention can be used in the CPU and the memory, etc.

FIG. 23F shows a front projector, which is comprised of a main body 2501, a light source 2502, a liquid crystal display device 2503, an optical system 2504 and a screen 2505. The invention can be used in the liquid crystal display device 2503, while the semiconductor circuit according to the invention can be used in the CPU and the memory, etc.

FIG. 24A shows a personal computer, which includes a main body 2601, an image input section 2602, a display section 2603, a keyboard 2604, etc. The electro-optical device according to the invention can be used in the display section 2603, while the semiconductor device according to the invention can be used in the CPU and the memory, etc.

FIG. 24B shows an electronic play machine (game machine), which includes a main body 2701, a recording medium 2702, a display section 2703 and a controller 2704. The voice and image outputted from this electronic game apparatus are reproduced by a display including a casing 2705 and a display portion 2706. As the means for communication between the controller 2704 and the main body 2701 or the means for communication between the electronic play apparatus and the display, wire communication, radio communication or optical communication can be used. This Embodiment is constituted in such a manner that infrared rays are sensed by sensor sections 2707 and 2708. The electro-optical device according to the invention can be used in the display sections 2703 and 2706, while the semiconductor device according to the invention can be used in the CPU and the memory, etc.

FIG. 24C shows a player (image reproducing apparatus) using a recording medium (hereinafter referred to as recording medium) on which a program is recorded; this player includes a main body 2801, a display portion 2802, a loudspeaker portion 2803, a recording medium 2804 and an operation switch 2805. Further, in this image reproducing apparatus, a DVD (Digital Versatile Disc), a CD or the like is used as the recording medium, and, through this apparatus, music and movies can be appreciated, games can be played, and internet communication can be performed. The electro-optical device according to the present invention can be used in the display portion 2802, the CPU and the memory.

FIG. 24D shows a digital camera, which includes a main body 2901, a display section 2902, an eye-piece section 2903, operation switches 2904, and an image receiving portion (not shown). The electro-optical device according to the invention can be used in the display section 2902, the CPU and the memory, etc.

FIGS. 25 shows in detail an optical engine which can be used in the rear projector shown in FIG. 23E and the front projector shown in FIG. 23F. FIG. 25A shows the optical engine, and FIG. 25B shows the optical system of the light source built in the optical engine.

The optical engine shown in FIG. 25A includes a light source optical system 3001, mirrors 3002, 3005 to 3007, dichroic mirrors 3003 and 3004, optical lenses 3008a to 3008c, a prism 3011, a liquid crystal display device 3010, and a projection optical system 3012. The projection optical system 3012 is an optical system comprising a projection lens. As this Embodiment, a three-plate type using three liquid crystal display devices 3010 is shown by way of example, but a single plate type may also be used. Further, in the optical path indicated by arrows in FIG. 25A, there may be provided an optical lens, a film having a polarizing function, a film for adjusting the phase difference or an IR film.

Further, as shown in FIG. 25B, the light source optical system 3001 includes light sources 3013 and 3014, a complex prism 3015, collimator lenses 3016 and 3020, lens arrays 3017 and 3018, and a polarization conversion element 3019. In the light source optical system shown in FIG. 25B, two light sources are used, but one light source or three or more light sources may be provided. Further, somewhere of the light source optical system, an optical lens, a film having a polarizing function, a film for adjusting the phase difference or an IR film may be provided.

As mentioned above, the range of application of the present invention is very wide; and the invention can be applied to electric appliances in every field. Further, the electric appliance according to this Embodiment can be realized by using a constitution comprising any combination of Embodiments 1 to 19.

Disposition of circuits having appropriate performance in accordance with the specifications required by the circuits over a substrate is available by using the present invention and the operation performance and reliability of the electro-optical device can be largely increased.

Further, in a pixel section of an electro-optical device typified by a liquid crystal display device, a storage capacitor having a large capacity can be formed in a small area. Accordingly the sufficient storage capacitance can be secured without reducing the aperture ratio even in an electro-optical device of diagonal 1 inch or less.

Further, the operation performance and the reliability of electric appliances that have such electro-optical device as a display section can be increased.

Figure 26:
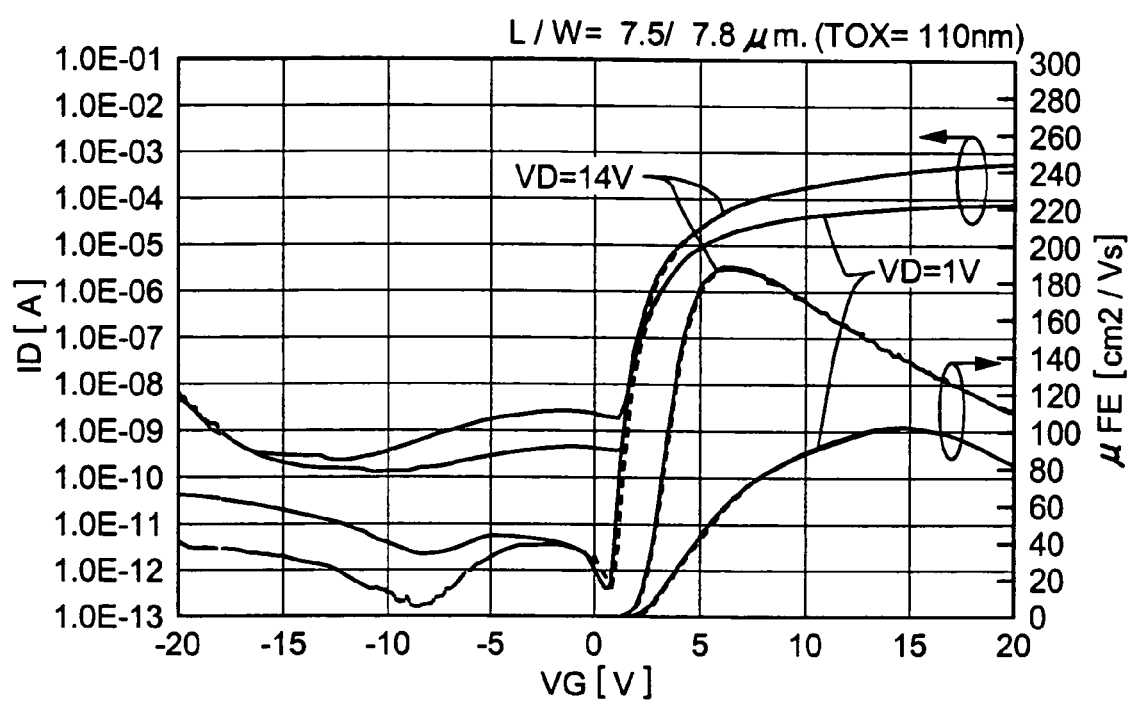

FIG. 26 shows a graph (hereinafter, referred to as a ID-VG curve) showing the relationship between the drain current (ID) and the gate voltage (VG) of the n-channel TFT 302 fabricated by the Embodiment 1, and a graph showing the field effect mobility ($\mu FE$). Here, a source voltage (VS) was 0V and a drain voltage (VD) was 1V or 14V. Incidentally, the n-channel TFT has a channel length (L) of 7.5μm, a channel width (W) of 7.8μm and a thickness of the gate insulating film (Tox) of 110 nm.

In FIG. 26, the bold line shows the ID-VG curve and the filed effect mobility prior to a stress test and the dotted line shows those after the stress test. It has been found founded that there is little change between before and after the stress test and the degradation due to the hot carriers is suppressed. Incidentally, the stress test here was performed at a room temperature with applying a source voltage 0V, a drain voltage 20V, a gate voltage 2V for 60 seconds to accelerate the hot carrier degradation.

What is claimed is:

1. A camera comprising a main body and a display device attached to the main body, said display device comprising:
    at least one first thin film transistor formed over a substrate and electrically connected to a pixel electrode, said first thin film transistor comprising:
        a semiconductor layer having a pair of impurity regions and a channel region extending therebetween;
        a gate electrode adjacent to the channel region with a gate insulating film interposed therebetween, and
        a pair of LDD regions between the channel region and the pair of impurity regions,
    a driver circuit formed over the substrate for driving said at least one first thin film transistor, said driver circuit including at least a second n-channel TFT and a third n-channel TFT,
    wherein said second n-channel TFT comprises:
        a semiconductor layer having source and drain regions and a channel region therebetween, and an LDD region interposed between the channel region and the drain region while the source region is contiguous to the channel region; and
        a gate electrode adjacent to the channel region with a gate insulating film interposed therebetween, wherein the gate electrode overlaps an entire portion of the LDD region, and
    wherein said third n-channel TFT comprises:
        a semiconductor layer having a pair of impurity regions and a channel region therebetween, and a pair of LDD regions interposed between the channel region and the pair of impurity regions; and
        a gate electrode adjacent to the channel region with a gate insulating film interposed therebetween, wherein the gate electrode partly overlaps the pair of LDD regions.

2. The camera according to claim 1 wherein said camera is a video camera.

3. The camera according to claim 1 wherein said camera is a digital camera.

4. The camera according to claim 1 wherein said first thin film transistor comprises an offset region.

5. A camera comprising a main body and a display device attached to the main body, said display device comprising:
    at least one first thin film transistor formed over a substrate and electrically connected to a pixel electrode, said first thin film transistor comprising:
        a semiconductor layer having a pair of impurity regions and a channel region extending therebetween;
        a gate electrode adjacent to the channel region with a gate insulating film interposed therebetween, and
        a pair of LDD regions between the channel region and the pair of impurity regions,
    an interlayer insulating film comprising an organic resin formed over the first thin film transistor;
    a storage capacitor electrically connected to the pixel electrode, said storage capacitor comprising:
        a shielding film formed over the interlayer insulating film;
        a portion of the pixel electrode overlapping the shielding film with a dielectric film interposed therebetween wherein the dielectric film comprises an oxide of a material of the shielding film,
    a driver circuit formed over the substrate for driving said at least one first thin film transistor, said driver circuit including at least a second n-channel TFT and a third n-channel TFT,
    wherein said second n-channel TFT comprises:
        a semiconductor layer having source and drain regions and a channel region. therebetween, and an LDD region interposed between the channel region and the drain region while the source region is contiguous to the channel region; and
        a gate electrode adjacent to the channel region with a gate insulating film interposed therebetween, wherein the gate electrode overlaps an entire portion of the LDD region, and
    wherein said third n-channel TFT comprises:
        a semiconductor layer having a pair of impurity regions and a channel region therebetween, and a pair of LDD regions interposed between the channel region and the pair of impurity regions; and
        a gate electrode adjacent to the channel region with a gate insulating film interposed therebetween, wherein the gate electrode partly overlaps the pair of LDD regions.

6. The camera according to claim 5 wherein said camera is a video camera.

7. The camera according to claim 5 wherein said camera is a digital camera.

8. The camera according to claim 5 wherein said first thin film transistor comprises an offset region.

9. A camera comprising a main body and a display device attached to the main body, said display device comprising:
    at least one first thin film transistor formed over a substrate and electrically connected to a pixel electrode, said first thin film transistor comprising:
        a semiconductor layer having a pair of impurity regions and a channel region extending therebetween;
        a gate electrode adjacent to the channel region with a gate insulating film interposed therebetween, and
        a pair of LDD regions between the channel region and the pair of impurity regions,
    a driver circuit formed over the substrate for driving said at least one first thin film transistor, said driver circuit including at least a second n-channel TFT and a third n-channel TFT,
    wherein said second n-channel TFT comprises:
        a semiconductor layer having source and drain regions and a channel region therebetween, and an LDD region interposed between the channel region and the drain region while the source region is contiguous to the channel region; and
        a gate electrode adjacent to the channel region with a gate insulating film interposed therebetween, wherein the gate electrode overlaps an entire portion of the LDD region, and
    wherein said third n-channel TFT comprises:
        a semiconductor layer having a pair of impurity regions and a channel region therebetween, and a pair of LDD regions interposed between the channel region and the pair of impurity regions; and a gate electrode adjacent to the channel region with a gate insulating film interposed therebetween, wherein the gate electrode partly overlaps the pair of LDD regions, wherein said third n-channel TFT is a part of a sampling circuit of the driver circuit.

10. The camera according to claim 9 wherein said camera is a video camera.

11. The camera according to claim 9 wherein said camera is a digital camera.

12. The camera according to claim 9 wherein said first thin film transistor comprises an offset region.

13. A camera comprising a main body and a display device attached to the main body, said display device comprising:
at least one first thin film transistor formed over a substrate and electrically connected to a pixel electrode, said first thin film transistor comprising:
a semiconductor layer having a pair of impurity regions and a channel region extending therebetween;
a gate electrode adjacent to the channel region with a gate insulating film interposed therebetween, and
a pair of LDD regions between the channel region and the pair of impurity regions,
a driver circuit formed over the substrate for driving said at least one first thin film transistor, said driver circuit including at least a second n-channel TFT and a third n-channel TFT,
wherein said second n-channel TFT comprises:
a semiconductor layer having source and drain regions and a channel region therebetween, and an LDD region interposed between the channel region and the drain region while the source region is contiguous to the channel region; and
a gate electrode adjacent to the channel region with a gate insulating film interposed therebetween, wherein the gate electrode overlaps an entire portion of the LDD region, and
wherein said third n-channel TFT comprises:
a semiconductor layer having a pair of impurity regions and a channel region therebetween, and a pair of LDD regions interposed between the channel region and the pair of impurity regions; and
a gate electrode adjacent to the channel region with a gate insulating film interposed therebetween, wherein the gate electrode partly overlaps the pair of LDD regions,
wherein said second n-channel TFT is a part of at least one of a shift register, a frequency dividing circuit, a signal splitting circuit, a level shifter or a buffer circuit of the driver circuit.

14. The camera according to claim 13 wherein said camera is a video camera.

15. The camera according to claim 13 wherein said camera is a digital camera.

16. The camera according to claim 13 wherein said first thin film transistor comprises an offset region.

17. A computer comprising a main body and a display device attached to the main body, said display device comprising:
at least one first thin film transistor formed over a substrate and electrically connected to a pixel electrode, said first thin film transistor comprising:
a semiconductor layer having a pair of impurity regions and a channel region extending therebetween;
a gate electrode adjacent to the channel region with a gate insulating film interposed therebetween, and
a pair of LDD regions between the channel region and the pair of impurity regions,
a driver circuit formed over the substrate for driving said at least one first thin film transistor, said driver circuit including at least a second n-channel TFT and a third n-channel TFT,
wherein said second n-channel TFT comprises:
a semiconductor layer having source and drain regions and a channel region therebetween, and an LDD region interposed between the channel region and the drain region while the source region is contiguous to the channel region; and
a gate electrode adjacent to the channel region with a gate insulating film interposed therebetween, wherein the gate electrode overlaps an entire portion of the LDD region, and
wherein said third n-channel TFT comprises:
a semiconductor layer having a pair of impurity regions and a channel region therebetween, and a pair of LDD regions interposed between the channel region and the pair of impurity regions; and
a gate electrode adjacent to the channel region with a gate insulating film interposed therebetween, wherein the gate electrode partly overlaps the pair of LDD regions.

18. The computer according to claim 17 further comprising a keyboard.

19. The computer according to claim 17 further comprising an image receiving section.

20. The computer according to claim 17 wherein said first thin film transistor comprises an offset region.

21. A computer comprising a main body and a display device attached to the main body, said display device comprising:
at least one first thin film transistor formed over a substrate and electrically connected to a pixel electrode, said first thin film transistor comprising:
a semiconductor layer having a pair of impurity regions and a channel region extending therebetween;
a gate electrode adjacent to the channel region with a gate insulating film interposed therebetween, and
a pair of LDD regions between the channel region and the pair of impurity regions,
an interlayer insulating film comprising an organic resin formed over the first thin film transistor;
a storage capacitor electrically connected to the pixel electrode, said storage capacitor comprising:
a shielding film formed over the interlayer insulating film;
a portion of the pixel electrode overlapping the shielding film with a dielectric film interposed therebetween wherein the dielectric film comprises an oxide of a material of the shielding film,
a driver circuit formed over the substrate for driving said at least one first thin film transistor, said driver circuit including at least a second n-channel TFT and a third n-channel TFT,
wherein said second n-channel TFT comprises:
a semiconductor layer having source and drain regions and a channel region therebetween, and an LDD region interposed between the channel region and the drain region while the source region is contiguous to the channel region; and
a gate electrode adjacent to the channel region with a gate insulating film interposed therebetween, wherein the gate electrode overlaps an entire portion of the LDD region, and wherein said third n-channel TFT comprises:
- a semiconductor layer having a pair of impurity regions and a channel region therebetween, and a pair of LDD regions interposed between the channel region and the pair of impurity regions; and
- a gate electrode adjacent to the channel region with a gate insulating film interposed therebetween, wherein the gate electrode partly overlaps the pair of LDD regions.

22. The computer according to claim 21 further comprising a keyboard.

23. The computer according to claim 21 further comprising an image receiving section.

24. The computer according to claim 21 wherein said first thin film transistor comprises an offset region.

25. A computer comprising a main body and a display device attached to the main body, said display device comprising:
- at least one first thin film transistor formed over a substrate and electrically connected to a pixel electrode, said first thin film transistor comprising:
  - a semiconductor layer having a pair of impurity regions and a channel region extending therebetween;
  - a gate electrode adjacent to the channel region with a gate insulating film interposed therebetween, and
  - a pair of LDD regions between the channel region and the pair of impurity regions,
- a driver circuit formed over the substrate for driving said at least one first thin film transistor, said driver circuit including at least a second n-channel TFT and a third n-channel TFT,
- wherein said second n-channel TFT comprises:
  - a semiconductor layer having source and drain regions and a channel region therebetween, and an LDD region interposed between the channel region and the drain region while the source region is contiguous to the channel region; and
  - a gate electrode adjacent to the channel region with a gate insulating film interposed therebetween, wherein the gate electrode overlaps an entire portion of the LDD region, and
- wherein said third n-channel TFT comprises:
  - a semiconductor layer having a pair of impurity regions and a channel region therebetween, and a pair of LDD regions interposed between the channel region and the pair of impurity regions; and
  - a gate electrode adjacent to the channel region with a gate insulating film interposed therebetween, wherein the gate electrode partly overlaps the pair of LDD regions,
- wherein said third n-channel TFT is a part of a sampling circuit of the driver circuit.

26. The computer according to claim 25 further comprising a keyboard.

27. The computer according to claim 25 further comprising an image receiving section.

28. The computer according to claim 25 wherein said first thin film transistor comprises an offset region.

29. A computer comprising a main body and a display device attached to the main body, said display device comprising:
- at least one first thin film transistor formed over a substrate and electrically connected to a pixel electrode, said first thin film transistor comprising:
  - a semiconductor layer having a pair of impurity regions and a channel region extending therebetween;
  - a gate electrode adjacent to the channel region with a gate insulating film interposed therebetween, and
  - a pair of LDD regions between the channel region and the pair of impurity regions,
- a driver circuit formed over the substrate for driving said at least one first thin film transistor, said driver circuit including at least a second n-channel TFT and a third n-channel TFT,
- wherein said second n-channel TFT comprises:
  - a semiconductor layer having source and drain regions and a channel region therebetween, and an LDD region interposed between the channel region and the drain region while the source region is contiguous to the channel region; and
  - a gate electrode adjacent to the channel region with a gate insulating film interposed therebetween, wherein the gate electrode overlaps an entire portion of the LDD region, and
- wherein said third n-channel TFT comprises:
  - a semiconductor layer having a pair of impurity regions and a channel region therebetween, and a pair of LDD regions interposed between the channel region and the pair of impurity regions; and
  - a gate electrode adjacent to the channel region with a gate insulating film interposed therebetween, wherein the gate electrode partly overlaps the pair of LDD regions,
- wherein said second n-channel TFT is a part of at least one of a shift register, a frequency dividing circuit, a signal splitting circuit, a level shifter or a buffer circuit of the driver circuit.

30. The computer according to claim 29 wherein said camera is a video camera.

31. The computer according to claim 29 wherein said camera is a digital camera.

32. The computer according to claim 29 wherein said first thin film transistor comprises an offset region.

* * * * *